United States Patent
Palm et al.

(10) Patent No.: US 12,334,860 B2
(45) Date of Patent: Jun. 17, 2025

(54) FACADE ELEMENTS WITH PATTERNED COVER PLATE AND OPTICAL INTERFERENCE LAYER

(71) Applicant: CNBM RESEARCH INSTITUTE FOR ADVANCED GLASS MATERIALS GROUP CO., LTD., Bengbu (CN)

(72) Inventors: Joerg Palm, Munich (DE); Lutz Tautenhahn, Dresden (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 153 days.

(21) Appl. No.: 17/263,129

(22) PCT Filed: Jul. 16, 2019

(86) PCT No.: PCT/CN2019/096167
§ 371 (c)(1),
(2) Date: Jan. 25, 2021

(87) PCT Pub. No.: WO2020/020016
PCT Pub. Date: Jan. 30, 2020

(65) Prior Publication Data
US 2021/0184624 A1    Jun. 17, 2021

(30) Foreign Application Priority Data
Jul. 27, 2018    (EP) ..................................... 18186175

(51) Int. Cl.
*H10F 77/70*    (2025.01)
*H02S 20/26*    (2014.01)
(Continued)

(52) U.S. Cl.
CPC ............. *H02S 20/26* (2014.12); *H10F 19/85* (2025.01); *H10F 77/315* (2025.01); *H10F 77/488* (2025.01); *H10F 77/707* (2025.01)

(58) Field of Classification Search
CPC ............... H01L 31/054; H01L 31/0547; H01L 31/0543; H01L 31/0232; H01L 31/02327;
(Continued)

(56) References Cited

U.S. PATENT DOCUMENTS 6,384,318 B1 *    5/2002    Nomura ................ H01L 31/048
                                                            136/246
2007/0188871 A1    8/2007    Fleury et al.
(Continued)

FOREIGN PATENT DOCUMENTS

CN        1867522 A        11/2006
CN        101246924 A        8/2008
(Continued)

OTHER PUBLICATIONS

English machine translation of Orita et al. (WO 2011/136177) published Nov. 3, 2011.*
(Continued)

*Primary Examiner* — Christina Chern
(74) *Attorney, Agent, or Firm* — Bayramoglu Law Offices LLC

(57) ABSTRACT

A façade element having a transparent cover plate and an opaque back element mounted on the cover plate. The cover plate has an outer surface facing the external environment and an inner surface facing the back element. The outer surface has a patterned region on which an interference layer is arranged. Alternatively, the interference layer is arranged on the inner surface. The inner surface and/or the outer surface have a patterned region having a height profile with hills and valleys. A portion of the patterned region is
(Continued)

Figure 3:
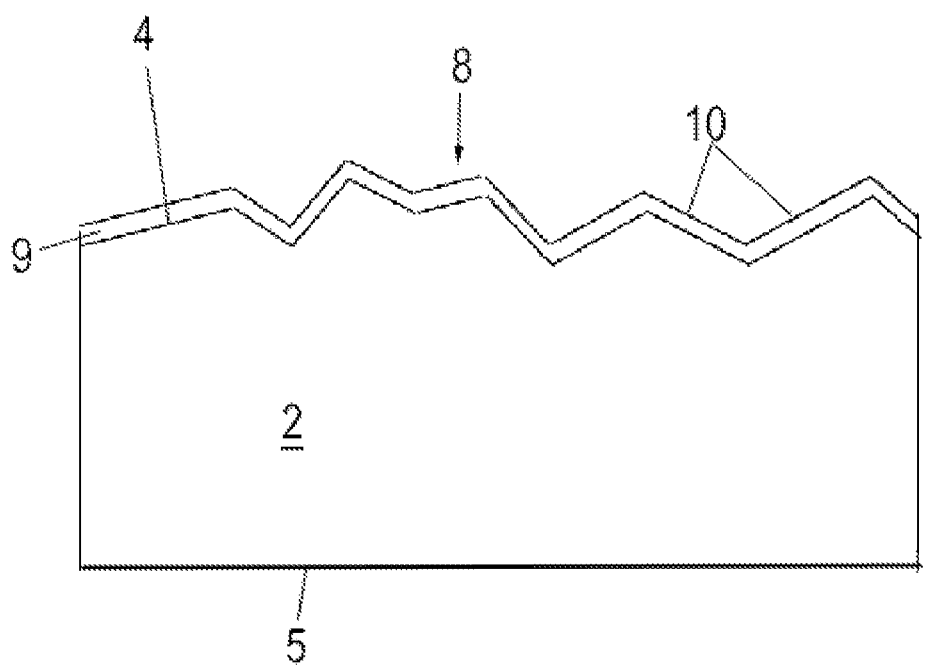

composed of flat segments that are inclined relative to the plane of the cover plate.

18 Claims, 20 Drawing Sheets

(51) Int. Cl.
*H10F 19/85* (2025.01)
*H10F 77/30* (2025.01)
*H10F 77/42* (2025.01)

(58) Field of Classification Search
CPC .......... H01L 31/0236; H01L 31/02366; H10F 77/70; H10F 77/707; H10F 77/40; H10F 77/42; H10F 77/315
See application file for complete search history.

(56) References Cited

U.S. PATENT DOCUMENTS

| | | | |
|---|---|---|---|
| 2007/0223095 A1 | 9/2007 | Brown | |
| 2009/0229655 A1 | 9/2009 | Lee | |
| 2010/0060987 A1 | 3/2010 | Witzman et al. | |
| 2010/0181014 A1 | 7/2010 | Raymond et al. | |
| 2010/0199577 A1 | 8/2010 | Sonneveld | |
| 2012/0183734 A1* | 7/2012 | Schiavoni | H01L 31/0392 264/319 |
| 2013/0247959 A1 | 9/2013 | Kwon et al. | |
| 2015/0241603 A1* | 8/2015 | Fujii | G02B 1/11 359/601 |
| 2017/0236962 A1 | 8/2017 | Beleznay et al. | |
| 2017/0345954 A1* | 11/2017 | Kang | H01L 31/02 |
| 2018/0130921 A1* | 5/2018 | Mayer | H01L 31/02168 |
| 2019/0235304 A1* | 8/2019 | Tamada | G02B 5/0221 |

FOREIGN PATENT DOCUMENTS

| | | | | |
|---|---|---|---|---|
| CN | 101339961 A | 1/2009 | | |
| CN | 101666886 A | 3/2010 | | |
| CN | 101811386 A | 8/2010 | | |
| CN | 102356473 A | 2/2012 | | |
| CN | 102403380 A | 4/2012 | | |
| CN | 202487586 U | 10/2012 | | |
| CN | 203603404 U | 5/2014 | | |
| CN | 104395081 A | 3/2015 | | |
| CN | 205573193 U | 9/2016 | | |
| CN | 103325871 B | 12/2016 | | |
| EP | 0404282 A1 | 12/1990 | | |
| EP | 2806464 A1 * | 11/2014 | ....... H01L 31/02165 |
| EP | 3599647 A1 | 1/2020 | | |
| EP | 3599649 A1 | 1/2020 | | |
| JP | 2002106151 A | 4/2002 | | |
| JP | 2002276090 A * | 9/2002 | ............... E04D 3/06 |
| JP | 2002343998 A * | 11/2002 | ........... H01L 31/042 |
| KR | 20100048453 A * | 5/2010 | ........... H01L 31/042 |
| WO | 2011/143015 A1 | 11/2011 | | |
| WO | WO-2011136177 A1 * | 11/2011 | ....... H01L 31/02168 |
| WO | 2013/158581 A1 | 10/2013 | | |
| WO | 2014/045142 A1 | 3/2014 | | |
| WO | 2016/020797 A2 | 2/2016 | | |
| WO | WO-2018158470 A2 * | 9/2018 | ............. B32B 17/04 |
| WO | 2020/020015 A1 | 1/2020 | | |
| WO | 2020/020019 A1 | 1/2020 | | |

OTHER PUBLICATIONS

English translation of Tachibana et al. (JP 2002 343998) published Nov. 29, 2002.*
Refractive index of TiO2 retrieved from https://refractiveindex.info/?shelf=main&book=TiO2&page=Devore-o on Dec. 7, 2023.*
Refractive index of SiO2 retrieved from https://refractiveindex.info/?shelf=main&book=SiO2&page=Malitson on Dec. 7, 2023.*
What Does Opaque Mean from DK Find Out retrieved from https://www.dkfindout.com/us/science/light/transparent-and-opaque-objects/ on Dec. 7, 2023.*
English machine translation of Tawada et al. (JP 2002-276090) published Sep. 25, 2002.*
English machine translation of An et al. (KR 2010-0048453) published May 11, 2010.*
International Search Report and Written Opinion for International Application No. PCT/CN2019/096163 filed on Jul. 16, 2019 on behalf of CNBM Bengbu Design & Res Institute for Glass Industry Co Ltd. Mail Date: Oct. 14, 2019. 8 Pages.
International Search Report and Written Opinion for International Application No. PCT/CN2019/096167 filed on Jul. 16, 2019 on behalf of CNBM Bengbu Design & Res Institute for Glass Industry Co Ltd. Mail Date: Oct. 16, 2019. 10 Pages.
International Search Report and Written Opinion for International Application No. PCT/CN2019/096226 filed on Jul. 16, 2019 on behalf of CNBM Bengbu Design & Res Institute for Glass Industry Co Ltd. Mail Date: Sep. 26, 2019. 8 Pages.

* cited by examiner

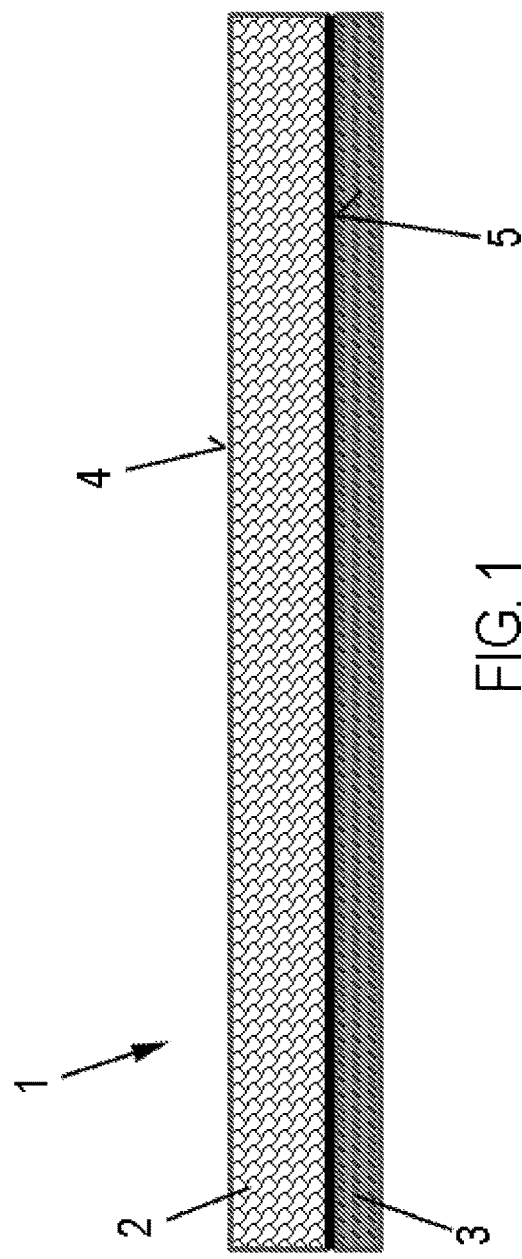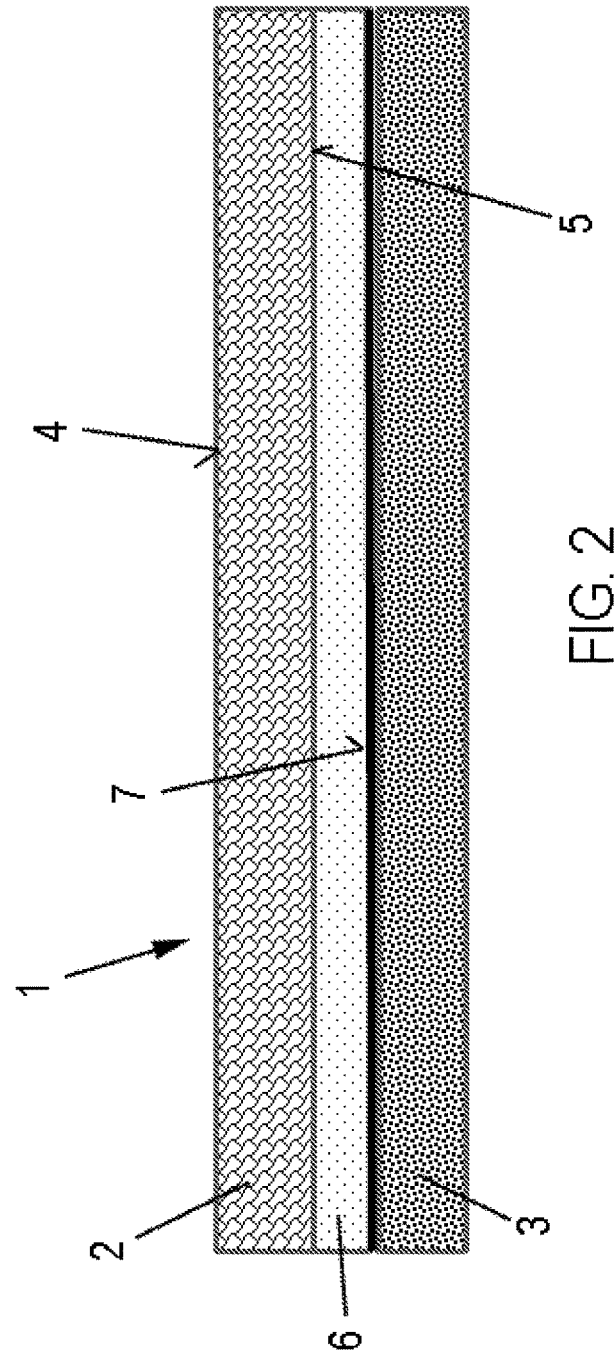

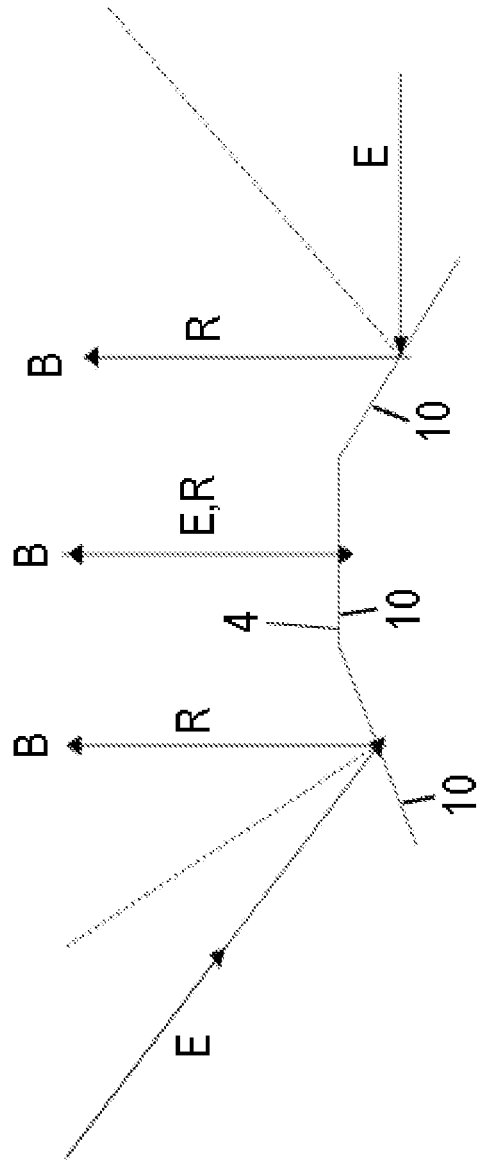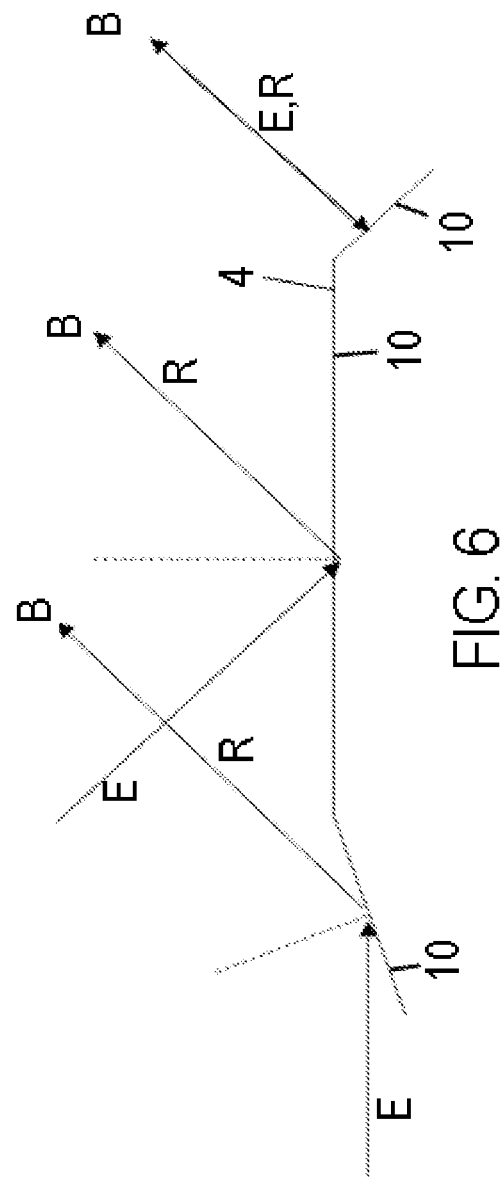

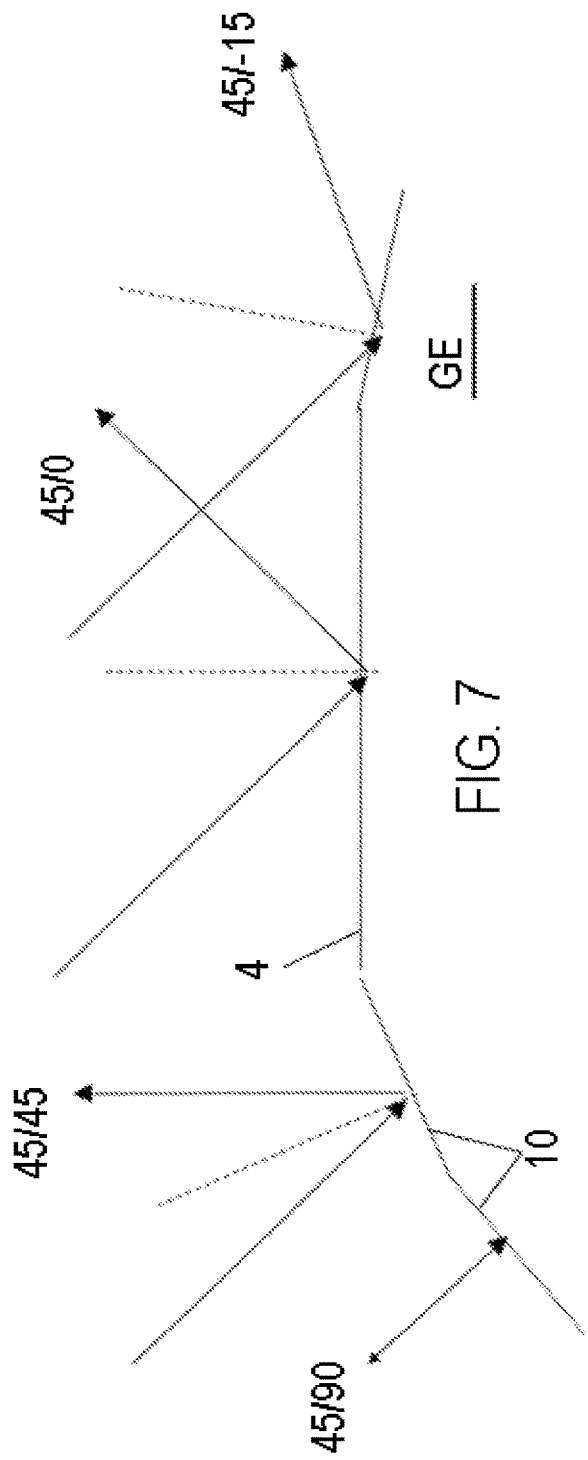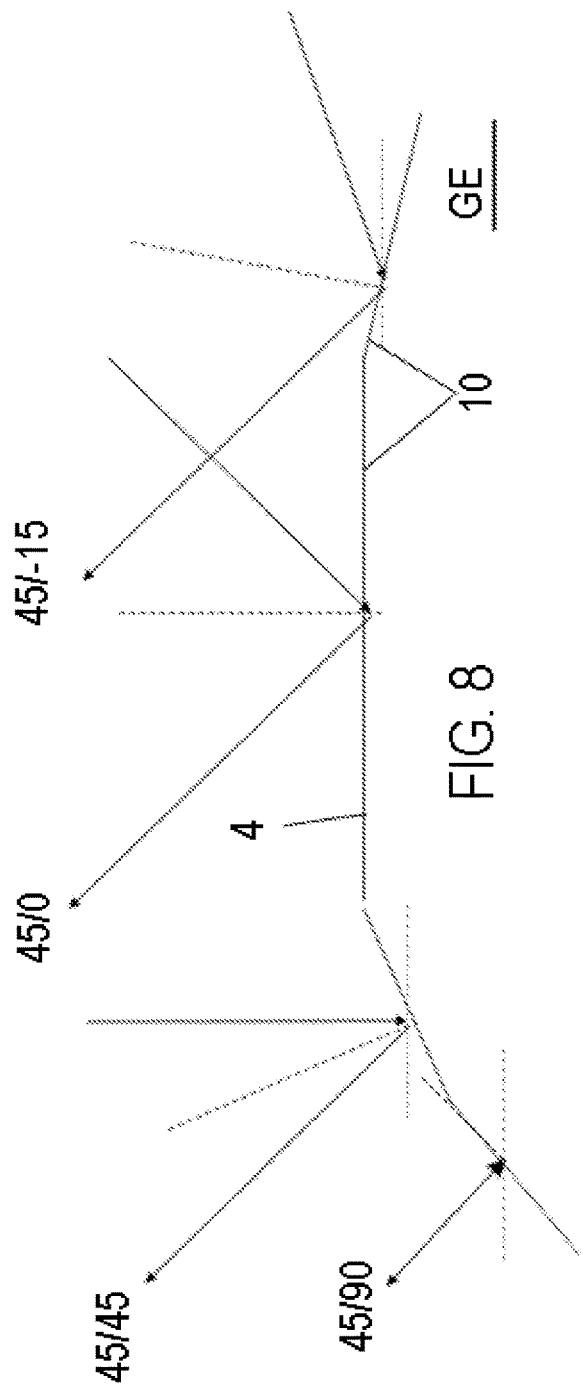

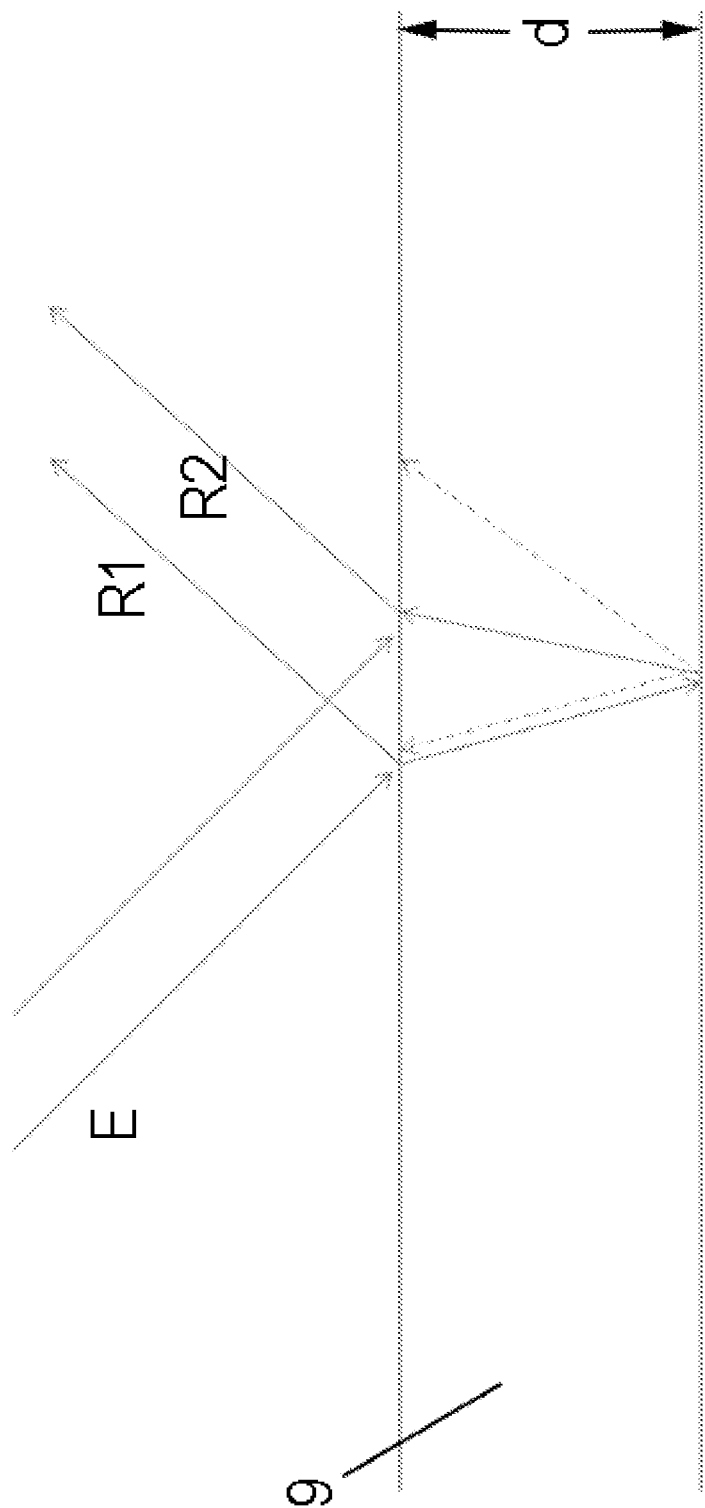

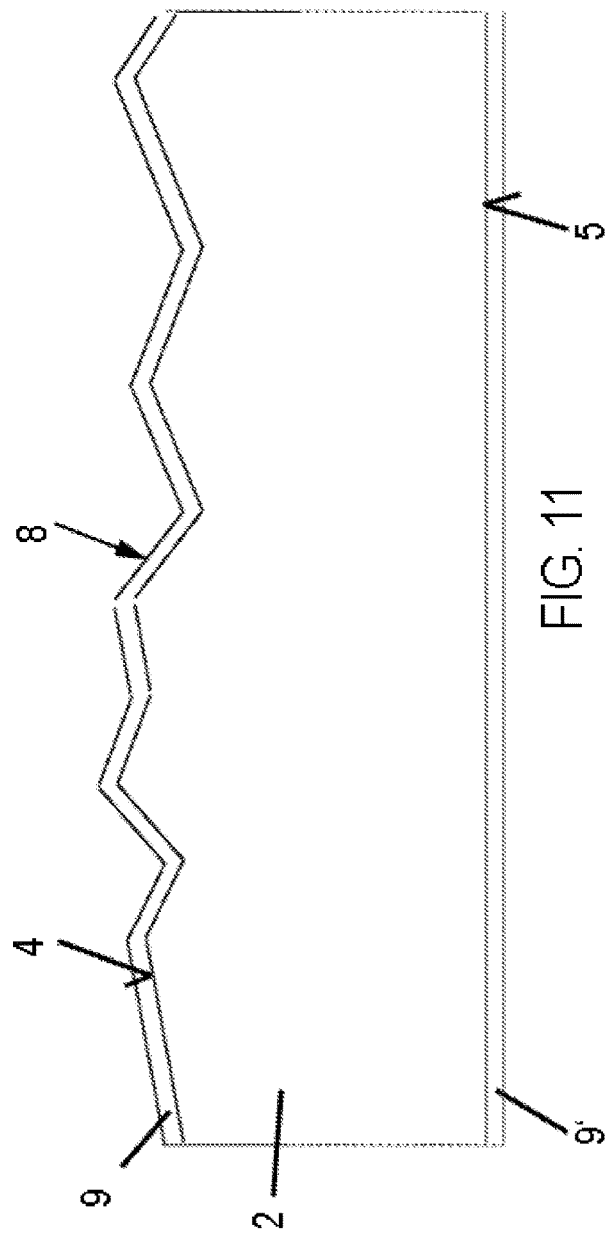
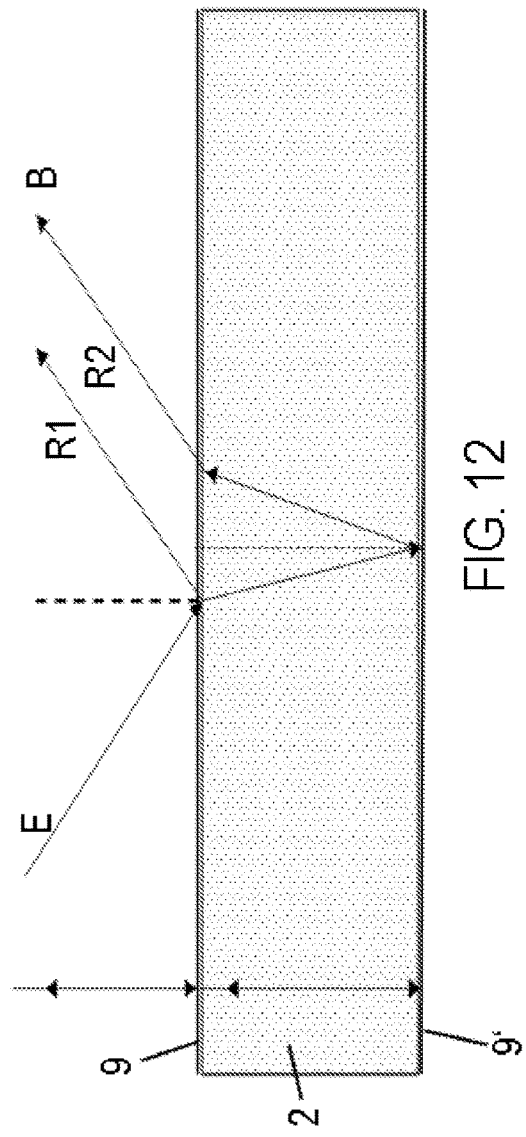

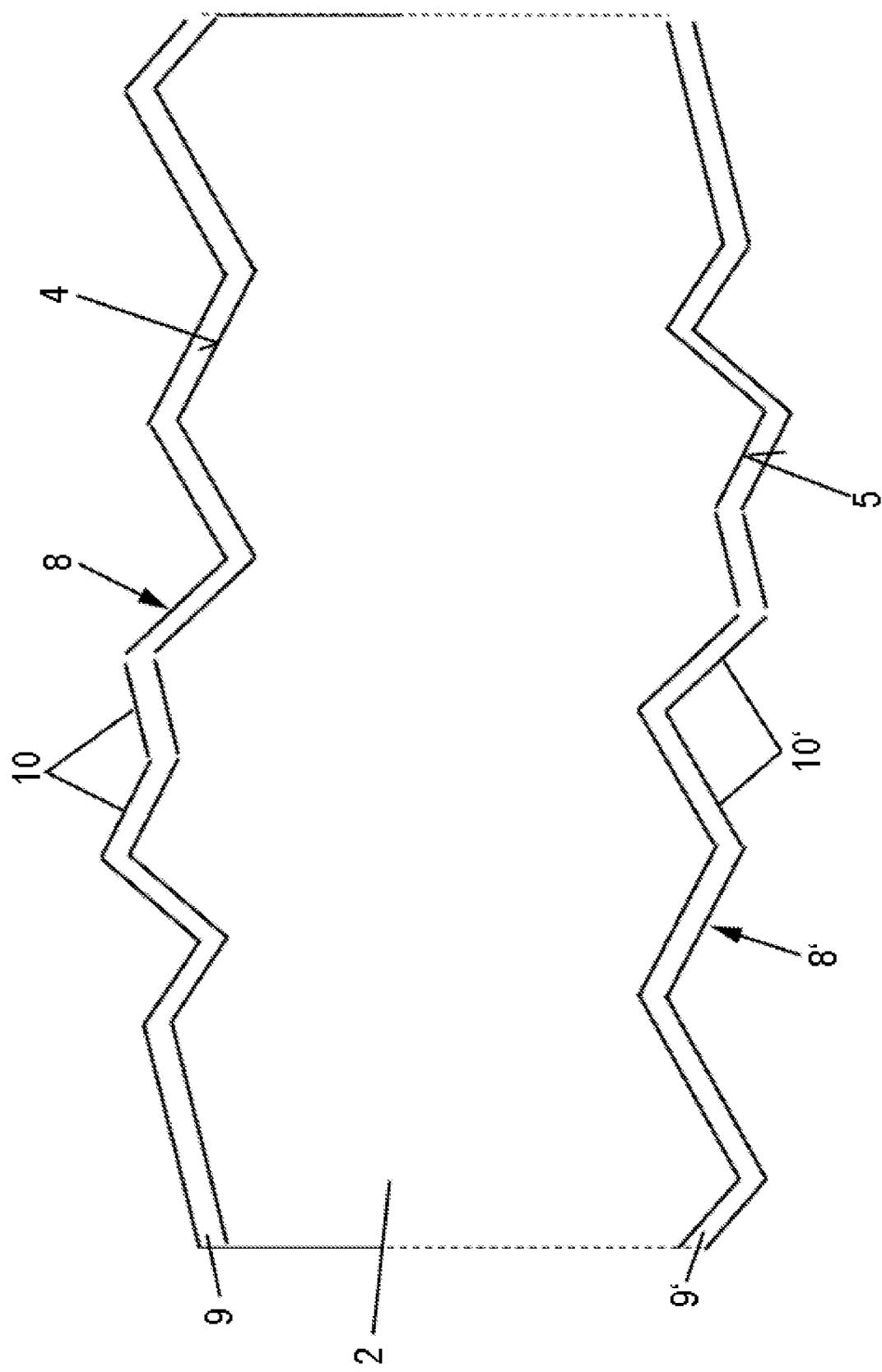

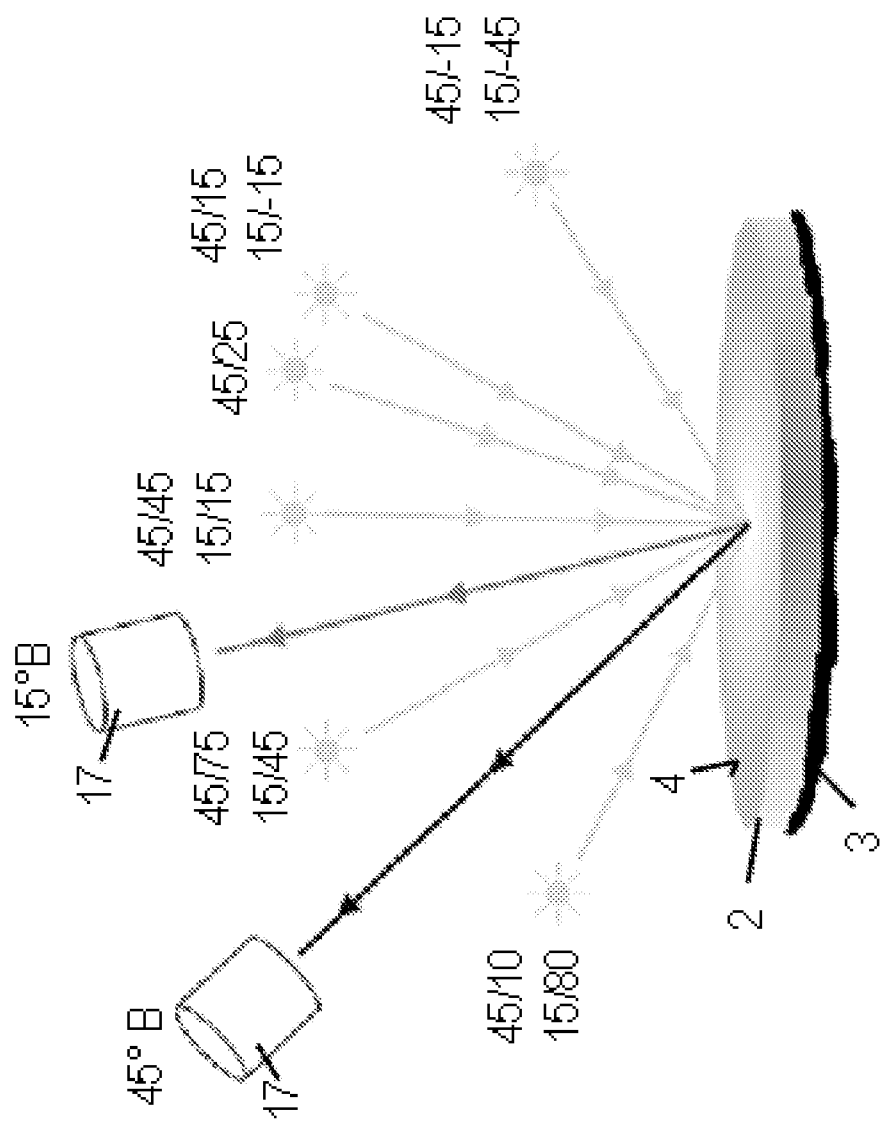

FACADE ELEMENTS WITH PATTERNED COVER PLATE AND OPTICAL INTERFERENCE LAYER

CROSS-REFERENCE TO RELATED APPLICATIONS

The present application is the U.S. National Stage of International Patent Application No. PCT/CN2019/096167 filed on Jul. 16, 2019 which, in turn, claims priority to European Patent Application No. EP 18186175.8 filed on Jul. 27, 2018.

The present invention is in the technical area of façade production and relates to colored façade elements with a patterned cover plate and at least one optical interference layer. The façade elements are intended to be used in particular in combination with colored solar modules. The invention further extends to methods for producing the façade elements according to the invention.

The use of solar modules as wall or façade elements is currently a market that is still economically relatively small but very interesting ecologically. In particular, in light of intensified efforts for decentralized energy solutions and energy neutral buildings, the demand for the use of solar modules as integrated components of building envelopes is increasing. Other interesting areas of application for solar modules are noise abatement walls (roadway, railway), privacy barriers in the outdoors, or walls for greenhouses. These new applications make completely new demands on solar modules, in particular in terms of aesthetics, service life, and other functionalities such as sealing and thermal insulation. In particular, the solar modules used for this would have to be available in various shapes, sizes, and colors and give the most homogeneous color impression possible. Depending on the origin of the color (absorption/re-emission, interference, refraction), the color of a per se homogeneous surface of the solar module can depend on the viewing angle and/or angle of incidence. Moreover, the spectrum and the physical distribution (diffuse, focused) of the light also determine the color impression.

The specific dimensioning of a façade or functional elements such as windows, doors, and balconies can require that colored solar modules in various sizes and shapes are needed in order to give the façade the most homogeneous color possible. Generally speaking, however, smaller and non-rectangular solar modules result in significant added costs. When the actual semiconductor stack is produced over a large area and smaller module sizes are created by division, this can result, in the of case of smaller solar modules, in significantly higher material usage per unit of power output. In addition, with relatively small solar modules, the ratio of module surface to module edge becomes more unfavorable such that the overall module efficiency levels are also smaller. Moreover, the costs of specific materials and fixed costs for attachment parts and edge sealing have a higher share of overall cost in the case of small solar modules.

Furthermore, in the case of different substrates sizes, specific steps of the production process can be implemented only with greatly modified plant designs.

In principle, the production of solar modules in various sizes and shapes would be technically possible; however, the industrial series production of solar modules is geared, for the reasons mentioned, to a few standard module sizes and usually to a rectangular shape of the solar modules such that a full-surface coating of a façade with solar modules js usually impossible or economically unacceptable. What's more, the photovoltaic design of solar cells and various attachment parts such as contact strips, junction boxes, and cables is optimized for the standard module sizes. Moreover, due to unfavorable orientation to the sun or shadowing by parts of the same building or adjacent buildings, it can be uneconomical to coat certain areas of a façade with solar modules, since their energy yield does not recoup the added costs.

To remedy the problem of the lack of suitable sizes and/or shapes of colored solar modules used as façade elements, photovoltaically passive façade elements made of sheet metal or other conventional construction materials can be used, whereby, obviously, their color should be as similar as possible to that of the colored solar modules. However, here, there is a technical and design problem due to the nature of color generation. In fact, the color of solar modules can change, depending on the origin of the color (absorption/re-emission, interference, refraction) under different lighting conditions, in particular depending on the type of light (diffuse, direct, light color), as well as due to a change in the incident angle and/or the viewing angle. When the photovoltaically passive façade elements are made of materials different from the colored solar modules, this typically creates color contrasts that are undesirable from the standpoint of design.

In contrast, the object of the present invention consists in making available a colored façade element, whose color depends as little as possible on light conditions as well as on the viewing angle and the incident angle.

Depending on the technology, there is, with colored solar modules, persistent angular dependence. In this case, the passive façade element should have the same angular dependence such that there is no undesirable optical contrast between façade areas with active façade elements and those with passive façade elements. In addition, for industrial series production, it is important that the colored façade elements can be produced in various sizes and shapes at acceptable costs and with satisfactory homogeneity. The colored façade elements should, in particular, serve to complement colored solar modules that are used as façade elements.

These and other objects are accomplished according to the proposal of the invention by photovoltaically passive (in other words, not suitable and not intended for photovoltaic current generation) colored façade elements and methods for their production according to the coordinate claims. Advantageous embodiments of the invention are indicated by the features of the dependent claims.

As used here and in the following, the term "façade element" refers to a structural component that is suitable and is intended to be able to be incorporated into a façade as a visible pane element. Generally speaking, the façade has an outer side and an inner side, with the outer side of the façade viewable from the external environment. The façade is, for example, a building wall or a freestanding wall, which serves, for example, as a privacy wall or a noise barrier. The façade element can be integrated into a façade as separate component, wherein the outer surface of the façade element is part of the outer side or outer surface of the façade.

Preferably, the colored façade element according to the invention is used in a façade in combination with colored solar modules whose cover plates have at least one patterned region and at least one optical interference layer. Such solar modules are described in the unpublished European patent applications EP18186153.5 and EP18186161.8. With regard to the structure and the use of these solar modules, reference is made to the disclosure of these two European patent applications in their entirety.

Presented according to the invention is a colored façade element that comprises a transparent (front) cover plate and an opaque back element mounted on the cover plate. The opaque back element is photovoltaically passive, in other words, unsuited for photovoltaic energy generation. The cover plate has an outer surface facing the external environment and an inner surface opposite the outer surface. The outer surface of the cover plate, in the installed state of the façade element in the façade, faces the external environment and forms, optionally with layers applied thereon, part of the outer side or outer surface of the façade. The opaque back element has a contact surface that is fixedly bonded to the inner surface of the cover plate. The back element covers at least 70%, preferably at least 90%, particularly preferably at least 99%, of the inner surface of the cover plate. Particularly preferably, the back element covers the inner surface of the cover plate over its entire surface (100%, i.e., complete coverage). The transparent cover plate is arranged on the front of the façade element.

According to one embodiment of the invention, the cover plate is made of one and the same material, for example, glass or plastic, preferably soda lime glass. Preferably, the cover plate is a rigid glass or plastic plate. The outer surface or inner surface of the cover plate is, in this case, formed from the respective material of the cover plate. According to an alternative embodiment of the invention, the cover plate is made of at least two different materials, with the outer surface and/or the inner surface of the cover plate formed from a material different from a core of the cover plate. The core of the cover plate is preferably made of one and the same material, for example, glass or plastic, preferably soda lime glass. Applied on the core of the cover plate, on the outside and/or the inside, is a material different from core of the cover plate, which is transparent and has the same optical refractive index as the material of the core of the cover plate. The outer surface or inner surface of the cover plate is, in this case, formed by the respective material that is applied on the core of the cover plate. According to the invention, the term "cover plate" also includes "composite body", provided that the materials that form the cover plate are transparent and have the same optical refractive index.

Preferably, the cover plate has no curvature and is thus planar (flat). The cover plate can, however, also be curved. The cover plate can be rigid or flexible. In the form of a flexible cover plate, it can be provided, so to speak, in planar form. In the case of a flat (planar) cover plate, a plane is defined by the cover plate itself, which, in the context of the invention, means "plane of the cover plate". In the case of a curved cover plate, a local plane, which also means "plane of the cover plate", can be defined by an (imaginary) flat tangential surface at any point of the plane.

The opaque back element is arranged on the back of the façade element. The back element contributes to the coloring of the façade element. For this purpose, the back element is, for example, achromatic, dark, and matte. It is also possible for the back element to be colored, in order to give, in combination with at least one coloring optical interference layer, which is arranged on the cover plate, the façade element a specific (predefined or pre-definable) color impression.

In the context of the present invention, the term "transparency" or "transparent" refers to visible-light transmittance of at least 85%, in particular at least 90%, preferably at least 95%, in particular 100%. Typically, visible light is in the wavelength range from 380 nm to 780 nm. The term "opacity" or "opaque" refers to visible-light transmittance of less than 5%, in particular 0%. The percentage data refer to the intensity of the light, measured in each case on one side of the cover plate or the back element, based on the intensity of the light striking the other side of the cover plate or the back element. For such a measurement, a white light source (source for visible light) can be arranged, for example, on one side of the cover plate or the back element; and a detector for visible light can be arranged on the other side of the cover plate or the back element. The values mentioned in the following for the optical refractive index always refer to the optical refractive index in the visible wavelength range from 380 nm to 780 nm.

The façade element according to the invention gives the viewer, during illumination from the outer side with white light, in particular during illumination with sunlight, a homogeneous color impression in at least one section, in other words, the façade element is colored. Preferably, the colored section extends over the entire outer surface of the façade element. Façade elements with a homogeneous color impression on the entire surface are considered particularly attractive. The color of the façade element can be described by three color coordinates L*, a*, b*, wherein the color coordinates refer to the (CIE)L*a*b* color space known per se to the person skilled in the art, in which all perceivable colors are defined exactly. This color space is specified in the European Standard EN ISO 11664-4 "Colorimetry—Part 4:CIE 1976 L*a*b* Colour Space", to which reference is made in its entirety within the present invention specification. In the (CIE)L*a*b* color space, each color is defined by a color location with the three Cartesian coordinates L*, a*, b*. Green and red are opposite one another on the a*-axis; the b*-axis runs between blue and yellow; the L*-axis describes the brightness (luminance) of the color. For a clearer representation, the values can be converted into the Lhc color space, wherein L remains the same and the saturation of the radius and h is the angle of a color point in the a*b* plane.

The color of the façade element is based on observation from the external environment, in other words, looking at the front cover plate. The colorimetry or the determination of the color coordinates of the façade element can be done in a simple manner by a commercially available colorimeter (spectrophotometer). For this purpose, the spectrophotometer is pointed at the outer surface of the front cover plate, in particular placed on the outer surface. Common spectrophotometers enable standard-compliant colorimetry, with their structure and tolerances typically subject to international standards, for example, defined by DIN 5033, ISO/CIE 10527, ISO 7724, and ASTM E1347. By way of example, reference is made with regard to colorimetry to the standard DIN 5033 in its entirety. A spectrophotometer has, for example, as a light source, a xenon flash lamp, a tungsten halogen lamp, or one or a plurality of LEDs, with which the outer surface of a body is illuminated with the light (e.g., white light) generated and light received from the façade element is measured. As explained in the introduction, the body color measured by the colorimeter results from the light reflected and re-emitted by the façade element.

In order to ensure that the façade element according to the invention has, a homogeneous color at least in one section, at least one surface (i.e., the outer surface and/or the inner surface) of the cover plate has at least one patterned region. In addition, at least one coloring optical interference layer is arranged on the cover plate. This is explained in detail below.

In accordance with a first aspect of the invention, the outer surface of the transparent cover plate has at least one patterned region, on which is arranged a coloring (transparent) optical interference layer for reflecting light within a predefined or pre-definable wavelength range. The optical interference layer ist preferably arranged directly (without another intermediate layer) on the outer surface of the cover plate. The optical interference layer can be implemented single-ply or multi-ply, in other words, have one or a plurality of light-refracting plies (refraction layers). The optical interference layer serves to generate the color of the façade element, with the optical interference layer implemented such that a constructive or destructive interference of light that is reflected on the various interfaces of the optical interference layer is possible. The color of the solar module results from the interference of the light reflected on the interfaces of the optical interference layer. Upon illumination with (white) light, in particular sunlight, the optical interference layer acts as a color filter to produce a homogeneous color. Preferably, the patterned region of the outer surface extends over the entire cover plate, i.e., over the entire outer surface of the cover plate, such that the entire façade element has a homogeneous color. The façade element can also have multiple façade element sections each with homogeneous color. The colors of the façade element sections can be the same or different from one another.

The at least one patterned region has, perpendicular to the plane of the cover plate, a height profile with hills (elevations) and valleys (depressions), wherein a mean height difference between the hills and valleys is at least 2 µm and, preferably, but not mandatorily, is a maximum of 20% of a thickness of the transparent cover plate. Also, at least 50% of the patterned region of the outer surface is composed of differently inclined segments or facets. The segments are sections of the surface of the cover plate directed toward the external environment and are implemented in each case as planar surfaces that are inclined relative to the plane of the cover plate. Here, at least 20% of the segments have, with reference to the plane of the cover plate, an inclination angle in the range from greater than 0° to a maximum of 15°; and at least 30% of the segments have an inclination angle in the range from greater than 15° to a maximum of 45°. Advantageously, but not mandatorily, less than 30% of the segments have an inclination angle greater than 45°. The patterns are preferably not periodic and anisotropic. However, for special optical effects, periodic structures and anisotropic structures can also be used.

Also, the segments are in each case flat (planar) and have a segment area of at least 1 µm². It is also true that in at least one zone (i.e., subregion) of the patterned region, the segments have in each case a mean roughness of less than 15% of a layer thickness of the optical interference layer that is applied on the patterned region. If the optical interference layer consists of multiple refraction layers, the segments of the at least one zone have in each case a mean roughness of less than 15% of a layer thickness of the refraction layer with the smallest layer thickness. The zone in which the segments each have a mean roughness of less than 15% of the layer thickness of the optical interference layer can correspond to the patterned region, i.e., the zone and the patterned region are then identical. The patterned region can, for example, be produced by etching, sandblasting, or rolling of the cover plate.

Accordingly, the at least one patterned region of the cover plate of the façade element has, per the first aspect of the invention, a plurality of flat (planar) segments. In the context of the present invention, flat (planar) segments can be formed by non-curved surfaces. It is, however, also possible for flat (planar) segments to be formed by slightly curved surfaces. In the context of the present invention, a segment is slightly curved when the following is true for each point of the segment: if, at a point of the segment, an (imaginary) tangential plane with an area of 1 µm² is constructed, the distance between the surface of the segment and the tangential plane based on the normal direction relative to the tangential plane is less than 50 nm.

In the context of the present invention, the term "patterning" or "patterned region" refers, in connection with the façade element per the first aspect of the invention, to a region of the outer surface or the inner surface of the cover plate in which the features described in the immediately preceding paragraph are present in combination.

By means of the features of the patterned region, it can advantageously be ensured that upon illumination of the cover plate with light, even upon viewing outside the glancing angle (angle of incidence of the incident light corresponds to the angle of reflection of the reflected light, with reference to the plane of the cover plate), light is reflected with relatively high intensity. The reason for this is the differently inclined segments that are present in sufficient number, suitable size, and suitable inclination angles to enable high intensity of the reflected light, even upon viewing outside the glancing angle. There are always enough inclined segments that scatter sufficient intensity in directions outside the glancing angle of the cover plate outward by refraction on the segments with patterning and inward by reflection on the segments with patterning.

As used here and in the following, the term "glancing angle" refers to the normal relative to the plane of the cover plate, in distinction from the "local glancing angle", which refers to the normal relative to the plane of a segment. Glancing angles and local glancing angles can be equal (segment is parallel relative to the plane of the cover plate), but are, generally speaking, different (segment is inclined relative to the plane of the cover plate).

As a result, it can be achieved that the intensity of the light not reflected in the glancing angle (i.e., scattered) is relatively high and in comparison with a reflecting surface without such a patterned region, has only little angular dependence relative to the incident direction and the viewing direction. By means of the optical interference layer, the light reflected outside the glancing angle can, depending on the refractive index and layer thickness of the optical interference layer, be subjected to a color selection such that the surface of the cover plate has a homogeneous color with relatively little angular dependence. The interference layer acts as a filter with the most narrowband reflection possible and broadband transmittance.

Advantageously in this regard, the patterned region has a height profile, in which a mean height difference between the hills and valleys is at least 2 µm, preferably at least 10 µm, and particularly preferably at least 15 µm. Such a patterned region can be produced by etching of the cover plate (e.g., cover glass). Equally advantageously in this regard, the patterned region has a height profile, in which a mean height difference between the hills and valleys is at least 50 µm, preferably at least 100 µm. Such a patterned region can be produced by rolling of the cover plate (e.g., cover glass). Accordingly, the invention advantageously extends to a façade element, of which at least one patterned region of the cover plate is produced by etching or rolling, by which means said height profiles can be produced. The patterns can, however, also be produced by applying a transparent and patterned layer on the cover plate. The layer must have the same (or at least a very similar) refractive index as the cover plate. According to the invention, the patterning of a surface of the cover plate should also include applying such a transparent and patterned layer.

The properties of the patterned region of the cover plate mentioned can be determined by conventional measuring devices, such as a microscope, in particular a confocal microscope or stylus profilometer.

Preferably, it is achieved by means of the at least one patterned region of the (uncoated) cover plate of the façade element per the first aspect of the invention that with viewing angles of 45° and 15° (in each case relative to the plane of the cover plate) and an angle of incidence that deviates by 45° from the respective glancing angle (in both directions), a brightness L of the reflected light of at least 10 occurs. Preferably, a brightness L of the reflected light of at least 15 and more preferably at least 20 occurs. During this measurement, a black cover is mounted on the side of the (uncoated) cover plate facing away from the side (i.e., inner surface) to be characterized. A D65 illuminant is used for the measurement and the brightness L is measured with a commercially available multi-angle spectrophotometer (10° aperture angle). The measurement setup is explained in detail below in connection with FIG. 26. In this context, reference is made to the European standard EN ISO 11664-4 in its entirety.

The invention extends accordingly per the first aspect of the invention to a façade element, comprising a transparent cover plate and an opaque back element mounted on the cover plate, wherein the cover plate has an outer surface facing the external environment and an inner surface facing the back element, wherein the outer surface has at least one patterned region, on which an optical interference layer for reflecting light within a predefined wavelength range is arranged, wherein the patterned region has the following features:
perpendicular to the plane of the cover plate, a height profile having hills and valleys, wherein a mean height difference between the hills and valleys is at least 2 µm,
at least 50% of the patterned region is composed of segments that are inclined relative to the plane of the cover plate, wherein, with reference to the plane of the cover plate, at least 20% of the segments have an inclination angle in the range from greater than 0° to a maximum of 15°, and at least 30% of the segments have an inclination angle in the range from greater than 15° to a maximum of 45°, wherein
the segments are in each case flat and have a segment area of at least 1 µm$^2$, wherein the segments have in each case a mean roughness of less than 15% of a layer thickness of the optical interference layer on the outer surface.

Here, it is advantageous for the patterned, uncoated cover plate provided with a black back surface, to be implemented such that with a viewing angle of 45° and 15° (based in each case on the plane of the cover plate) and an angle of incidence that deviates by 45° from the respective glancing angle (in both directions), a brightness L of the reflected light of at least 10, at least 15, or at least 20 occurs.

The invention equally extends per the first aspect of the invention to a façade element comprising a transparent cover plate and an opaque back element mounted on the cover plate, wherein the cover plate has an outer surface facing the external environment and an inner surface facing the back element, wherein the outer surface has at least one patterned region, on which an optical interference layer for reflecting light within a predefined wavelength range is arranged, wherein the uncoated cover plate provided with a black back surface and having at least one patterned region is implemented such that with a viewing angle of 45° and 15° (based in each case on the plane of the cover plate) and an angle of incidence that deviates by 45° from the respective glancing angle (in both directions), a brightness L of the reflected light of at least 10, at least 15, or at least 20 occurs In a preferred embodiment of the façade element according to the invention per the first aspect of the invention, the outer surface of the cover plate is provided with at least one patterned region, on which a coloring optical interference layer is arranged. In addition, the inner surface of the cover plate has no patterned region and no optical interference layer. The inner surface is preferably smooth (within the limits of production imprecisions). The optical interference layer is preferably arranged directly on the outer surface of the cover plate (in other words, without an additional intermediate layer).

In another preferred embodiment of the façade element according to the invention per the first aspect of the invention, the outer surface of the cover plate is provided with at least one patterned region, on which a coloring optical interference layer is arranged. In addition, the inner surface has no patterned region, with another optical interference layer for reflecting light within a predefined wavelength range arranged on the inner surface of the cover plate. The inner surface is preferably smooth (within the limits of production imprecisions). The above statements concerning the optical interference layer on the outer surface of the cover plate apply analogously for the optical interference layer on the inner surface of the cover plate. The two optical interference layers can be the same or different from one another. In particular, the two optical interference layers for reflecting light are implemented within one and the same wavelength range. However, it is also possible for the two optical interference layers for reflecting light to be implemented within different or only partially overlapping wavelength ranges. The layer thicknesses and refractive indices of the two optical interference layers can be the same or different from one another. By this measure, the color of the façade element can be even better defined. In addition, mixed colors can be generated.

In another preferred embodiment of the façade element according to the invention per the first aspect of the invention, the outer surface of the cover plate is provided with at least one patterned region, on which a coloring optical interference layer is arranged. In addition, the inner surface has at least one patterned region, on which an optical interference layer for reflecting light within a predefined wavelength range is arranged. The above statements concerning the patterned region of the outer surface of the cover plate apply analogously for the patterned region of the inner surface of the cover plate. The patterned region of the inner surface and the patterned region of the outer surface can be the same or different from one another. For the additional optical interference layer on the inner surface of the cover plate, the statements in this regard in the immediately preceding embodiment of the façade element apply analogously, wherein the layer thicknesses and refractive indices of the two optical interference layers can be the same or different from one another. Through these measures as well, the color of the façade element can be even better defined. In addition, mixed colors can be generated.

It is common to all embodiments described above per the first aspect of the invention that already when the light strikes the patterned outer surface with an interference layer as a result of reflection and interference, a color with high intensity and little angular dependence develops even outside the glancing angle. The additional interference layer and/or patterning on the inner surface can further strengthen this effect.

Per a second aspect of the invention, a façade element with a transparent cover plate and an opaque back element mounted on the cover plate is presented. In order to avoid unnecessary repetitions, the differences relative to the façade element per the first aspect of the invention are described, and, otherwise, reference is made to the statements above. In particular, statements above concerning the optical interference layer(s) apply analogously. However, the at least one patterned region of the cover plate of the façade element per the second aspect of the invention differs from the at least one patterned region of the cover plate of the façade element per the first aspect of the invention, as is explained below.

In the façade element per the second aspect of the invention, a coloring optical interference layer for reflecting light within a predefined or pre-definable wavelength range is arranged on the inner surface of the cover plate. The optical interference layer is preferably arranged directly (without another intermediate layer) on the inner surface of the cover plate. In addition, the inner surface and/or the outer surface of the cover plate has in each case at least one patterned region, provided that either the outer surface has at least one patterned region or an additional optical interference layer for reflecting light within a predefined or pre-definable wavelength range is arranged on the outer surface. The optical interference layer is preferably arranged directly (without another intermediate layer) on the outer surface of the cover plate. This means that no optical interference layer is arranged on the outer surface when the outer surface has at least one patterned region.

As explained below, it is common to all embodiments of this second aspect of the invention that the light must pass through the cover plate at least once and be reflected on the inner interference, in order to achieve the desired chromaticity with improved angular stability.

The at least one patterned region of the cover plate of the façade element per the second aspect of the invention has, perpendicular to the plane of the cover plate, a height profile with hills (elevations) and valleys (depressions), wherein a mean height difference between the hills and valleys is at least 2 μm and, preferably, but not mandatorily, is a maximum of 20% of a thickness of the transparent cover plate. Also, at least 50% of the patterned region of the outer surface is composed of differently inclined segments or facets. Here, at least 20% of the segments have, with reference to the plane of the cover plate, an inclination angle in the range from greater than 0° to a maximum of 15° and at least 30% of the segments have an inclination angle in the range from greater than 15° to a maximum of 45°. Advantageously, but not mandatorily, less than 30% of the segments have an inclination angle greater than 45°. The patterns are preferably not periodic and anisotropic. However, for special optical effects, periodic structures and anisotropic structures can also be used. If the inner surface has at least one patterned region, the segments of the patterned region of the inner surface are in each case flat, have a segment area of at least 1 μm² and a mean roughness of less than 15% of a layer thickness of the optical interference layer on the inner surface. If the optical interference layer consists of multiple refraction layers, the segments of the at least one zone have in each case a mean roughness of less than 15% of a layer thickness of the refraction layer with the smallest layer thickness. The zone, in which the segments have in each case a mean roughness of less than 15% of the layer thickness of the optical interference layer, can correspond to the patterned region, i.e., the zone and the patterned region are then identical. In principle, the requirement for the roughness of the segments only has to be met if an optical interference layer is arranged on a patterned region. This is true only for the at least one patterned region of the inner surface. If the outer surface has at least one patterned region, there is no requirement for the roughness of the segments of the patterned region, because the outer surface either has at least one patterned region or an optical interference layer is arranged on the outer surface, but there is no optical interference layer on a patterned region of the outer surface.

Accordingly, for the case in which the inner surface has at least one patterned region, the patterned region has a plurality of flat (planar) segments. In the context of the present invention, flat (planar) segments can be formed by non-curved surfaces. It is, however, also possible for flat (planar) segments to be formed by slightly curved surfaces. In the context of the present invention, a segment is slightly curved when the following is true for each point of the segment: if at a point of the segment, an (imaginary) tangential plane with an area of 1 μm² is constructed, the distance between the surface of the segment and the tangential plane based on the normal direction relative to the tangential plane is less than 50 nm.

In the context of the present invention, the term "patterning" or "patterned region" refers, in connection with the façade element per the second aspect of the invention, to a region of the outer surface or the inner surface of the cover plate in which the features described in the immediately preceding paragraph are present in combination.

Light is reflected by the inner and/or outer patterned surface of the cover plate with high intensity and low angular dependence even outside the glancing angle, since the inside interference layer is an interface with a relatively high refractive index. With patterning on the outside, the light is already refracted at the air/cover plate interface and strikes the inside interference layer diffusely from a variety of angles. With only inside patterning, its scattering occurs at this inner interface since, according to the invention, many surface segments with different inclination angles are available. In addition, as a result of the coloring optical interference layer, a good homogeneous color impression is achieved. The interference layer acts as a filter with the best possible narrowband reflection and broadband transmittance.

Preferably, it is achieved by means of the at least one patterned region of the (uncoated) cover plate of the façade element according to the invention per the second aspect, that with viewing angles of 45° and 15° (in each case based on the normal relative to the plane of the cover plate) and an angle of incidence that deviates by 45° from the respective glancing angle (in both directions), a brightness L of the reflected light of at least 10 occurs. Preferably, a brightness L of the reflected light of at least 15 and more preferably of at least 20 occurs. During this measurement, a black cover is mounted on the side of the (uncoated) cover plate facing away from the side (i.e., inner surface) to be characterized. A D65 illuminant is used for the measurement and the brightness L is measured with a commercially available multi-angle spectrophotometer (10° aperture angle). The measurement setup is explained in detail below in connection with FIG. 26. In this context, reference is made to the European standard EN ISO 11664-4 in its entirety.

The invention extends accordingly per the second aspect of the invention to a façade element, comprising a transparent cover plate and an opaque back element mounted on the cover plate, wherein the cover plate has an outer surface facing the external environment and an inner surface facing the back element, wherein an optical interference layer for reflecting light within a predefined wavelength range is arranged on the inner surface, wherein the inner surface and/or the outer surface has in each case at least one patterned region, wherein either the outer surface has at least one patterned region or another optical interference layer for reflecting light within a predefined wavelength range is arranged on the outer surface, wherein the patterned region has the following features:

perpendicular to the plane of the cover plate, a height profile having hills and valleys, wherein a mean height difference between the hills and valleys is at least 2 µm, at least 50% of the patterned region is composed of segments that are inclined relative to the plane of the cover plate, wherein, with reference to the plane of the cover plate, at least 20% of the segments have an inclination angle in the range from greater than 0° to a maximum of 15°, and at least 30% of the segments have an inclination angle in the range from greater than 15° to a maximum of 45°, wherein if the inner surface has at least one patterned region, the segments of the patterned region of the inner surface are in each case flat, have a segment area of at least 1 µm$^2$ and a mean roughness of less than 15% of a layer thickness of the optical interference layer on the inner surface.

The invention equally extends per the second aspect of the invention to a façade element, comprising a transparent cover plate and an opaque back element mounted on the cover plate, wherein the cover plate has an outer surface facing the external environment and an inner surface facing the back element, wherein an optical interference layer for reflecting light within a predefined wavelength range is arranged on the inner surface, wherein the inner surface and/or the outer surface has in each case at least one patterned region, wherein either the outer surface has at least one patterned region or another optical interference layer for reflecting light within a predefined wavelength range is arranged on the outer surface, wherein the uncoated cover plate provided with a black back surface and having at least one patterned region is implemented such that with a viewing angle of 45° and 15° (based in each case on the plane of the cover plate) and an angle of incidence that deviates by 45° from the respective glancing angle (in both directions), a brightness L of the reflected light of at least 10, at least 15, or at least 20 occurs In a preferred embodiment of the façade element according to the invention per the second aspect of the invention, an optical interference layer is arranged on the inner surface of the cover plate, wherein the inner surface of the cover plate has no patterned region and the outer surface has at least one patterned region, wherein no further optical interference layer is arranged on the outer surface. The inner surface is preferably smooth (within the limits of production imprecisions). For the segments of the patterned region of the outer surface of the façade element, there is no requirement for roughness. The patterned outer surface can even have relatively great microscopic roughness. At this interface, only transmittance, refraction, and scattering occur, but no interference. In this embodiment of the façade element according to the invention, it can be advantageous for the outer surface of the cover plate to be coated with a (for example, thin) antireflection layer whose optical refractive index is less than that of the cover plate. By this means, a substantially white reflection of a cover plate (for example, glass) can be prevented and the saturation level of the colors increases. However, an additional layer on the outer surface can also have the same refractive index as the cover plate. In this case, the layer serves only for protection of the cover plate against moisture and other corrosive components of the air. It has been found that glasses satinized by etching are more sensitive to moist heat than planar or rolled glasses. In the case of etched soda lime glass, the additional layer can be, for example, a thin sputtered $SiO_2$ layer.

In another preferred embodiment of the façade element according to the invention per the second aspect of the invention, an optical interference layer is arranged on the inner surface of the cover plate, wherein the inner surface of the cover plate has at least one patterned region and the outer surface has at least one patterned region, with no further optical interference layer arranged on the outer surface. The patterned region of the inner surface and the patterned region of the outer surface can be the same or different from one another. For the segments of the patterned region of the outer surface of the façade element, there is no requirement for the roughness. The patterned outer surface can even have relatively great microscopic roughness. At this interface, only transmittance, refraction, and scattering occur, but no interference. The aforementioned requirement for roughness applies to the segments of the patterned region of the inner surface of the façade element, since an optical interference layer is arranged on the patterned region. When the outer surface is patterned and the interference layer is on the inner surface, the angular stability results from the fact that the light is refracted upon entry through the patterned outer surface on the differently inclined segments, strikes the interference layer at different angles, and, after interference and reflection, passes an additional time through the patterned outer surface while exiting from the cover plate, and changes its direction again due to refraction.

In another preferred embodiment of the façade element according to the invention per the second aspect of the invention, an optical interference layer is arranged on the inner surface of the cover plate, wherein the inner surface of the cover plate has at least one patterned region and the outer surface has no patterned region, with no further optical interference layer arranged on the outer surface. The outer surface is preferably smooth (within the limits of production imprecisions). The aforementioned requirement for roughness applies to the segments of the patterned region of the inner surface of the façade element since an optical interference layer is arranged on the patterned region. In this embodiment of the façade element according to the invention, it can be advantageous for the outer surface of the cover plate to be coated with a (for example, thin) antireflection layer whose index of refraction is smaller than that of the cover plate. By this means, a substantially white reflection of a glass cover plate can be prevented and the saturation level of the colors increases.

In another preferred embodiment of the façade element according to the invention per the second aspect of the invention, an optical interference layer is arranged on the inner surface of the cover plate, wherein the inner surface of the cover plate has at least one patterned region and the outer surface has no patterned region, with a further optical interference layer arranged on the outer surface. The outer surface is preferably smooth (within the limits of production imprecisions). The aforementioned requirement for roughness applies to the segments of the patterned region of the inner surface of the façade element since an optical interference layer is arranged on the patterned region. The two optical interference layers can be the same or different from one another. In particular, the two optical interference layers for reflecting light can be implemented within one and the same wavelength range. However, it is also possible for the two optical interference layers for reflecting light to be implemented within different or only partially overlapping wavelength ranges. The interference layer on the smooth outer side can also be a color-neutral antireflection layer in order to reduce the white component of the reflected light as a whole. The color is created by reflection on the patterned inner side with the interference layer. The interference layer on the smooth outer side can however also be a coloring layer that intensifies the color generated on the inner side or mixes therewith an additional color component with a different wavelength.

It is common to all above-described embodiments of the second aspect of the invention that the light must pass at least once through the cover plate and be reflected on the inner interference layer in order to achieve, after exit, the desired chromaticity with improved angular stability.

The following statements refer equally to the façade element per the first or second aspect of the invention.

In the façade element according to the invention, as a result of the patterned cover plate, light is reflected with high intensity and low angular dependence even outside the glancing angle. As a result of the at least one optical interference layer, which acts to give color, a very homogeneous color impression is produced.

In an advantageous embodiment of the façade element according to the invention, at least 80%, particularly preferably at least 90%, of a patterned region of the outer surface or the inner surface (depending on which surface is patterned) is composed of the segments inclined relative to the plane of the cover plate. By increasing the number of segments, the intensity of the light reflected by the patterned region of the surface of the cover plate even outside the glancing angle and its angular stability can be even further increased.

In another advantageous embodiment of the façade element according to the invention, at least 30% of the segments at least of one patterned region have an inclination angle in the range from greater than 0° to a maximum of 15°; at least 40% of the segments have an inclination angle in the range from greater than 15° to a maximum of 45°, and preferably, but not mandatorily, less than 10% of the segments have an inclination angle greater than 45°. Particularly preferably, at least 40% of the segments have an inclination angle in the range from greater than 0° to a maximum of 15°; at least 50% of the segments have an inclination angle in the range from greater than 15° to a maximum of 45°; and preferably, but not mandatorily, less than 10% of the segments have an inclination angle greater than 45°. If relatively many facets with a small inclination angle of less than 15° are present, essentially only a reflected intensity at a viewing angle near the glancing angle occurs (as in the case of an unpatterned surface), which is undesirable according to the invention. With steeper facets, the angular dependence of the reflected light is reduced; however, with numerous very steep facets (greater than 45°), multiple reflections can increasingly occur, which is disadvantageous. In addition, with many coating methods, it is difficult to ensure conforming coverage with equal layer thickness simultaneously on flat and steep surface segments. The layer thickness of the optical interference layer would thus depend on the inclination angle, again resulting in undesirable angle dependences.

Most preferable in this regard is an embodiment in which the segments have in each case an inclination angle that is greater than 0° and is a maximum of 45°. In accordance with the preceding conditions, a very high intensity of reflected light can be achieved even outside the glancing angle with, at the same time, particularly little angular dependence of the intensity. The patterns are preferably not periodic and anisotropic. However, for specific optical effects periodic patterns and/or anisotropic patterns can also be used. Periodic and anisotropic patterns such as pyramids, tetragonal or hexagonal honeycomb patterns, or hemispheres can also be produced well with rolling during glass drawing. They can be used for attractive gloss and color effects. When the surface patterns satisfy the aforementioned conditions, the façade elements in turn present a significantly reduced decrease in chromaticity for angles outside the glancing angle; however, the angle dependences are then anisotropic relative to the orientation on in the plane of the cover plate.

The at least one optical interference layer can include one or a plurality of refraction layers and, in particular, be made thereof. A refraction layer is made of one and the same material (with the same composition) and has in particular a homogeneous (equal) refractive index over the entire layer thickness. When the optical interference layer includes multiple refraction layers, at least two refraction layers are made of a material different from one another and have a different refractive index. Advantageously, at least one refraction layer has a refractive index n greater than 1.7, preferably greater than 2.0, and particularly preferably greater than 2.3. In principle, the greater the refractive index, the lower the angular dependence of the reflected light, such that the angular dependence of the color impression can be further reduced.

Advantageously, the optical interference layer contains at least one compound, selected from $TiO_x$, $ZrO_x$, SiC, and $Si_3N_4$. If the optical interference layer has two, three, or more plies, the optical interference layer preferably contains at least one compound, selected from $MgF_2$, $Al_2O_3$, $SiO_2$, and silicon oxynitride. These are compounds with a relatively low refractive index.

In the façade element according to the invention, due to the combination of a patterned surface with an optical interference layer that has only a small number of refraction layers (e.g., one to three refraction layers), a good color impression can already be achieved. As a result of the small number of refraction layers, the production of the façade element is simplified and the production costs are reduced.

Advantageously, at least one optical interference layer (in particular all optical interference layers) of the façade element includes exactly one refraction layer (or is made thereof), whose refractive index n is greater than 1.9, preferably greater than 2.3.

Equally advantageously, at least one optical interference layer (in particular all optical interference layers) of the façade element includes exactly two refraction layers (or is made thereof), wherein a first refraction layer with a first refractive index n1 is present on the cover plate with a refractive index nd and a second refraction layer with a second refractive index n2 is present on the first refraction layer. For the amounts (absolute values) of the differences in the refractive indices: |n1-nd|>0.3 and |n2-n1|>0.3, and at least one of the refractive indices n1 or n2 is greater than 1.9, preferably greater than 2.3.

Equally advantageously, at least one optical interference layer (in particular all optical interference layers) of the façade element includes exactly three refraction layers (or is made thereof), wherein a first refraction layer with a first refractive index n1 is present on the cover plate with a refractive index nd, a second refraction layer with a second refractive index n2 is present on the first refraction layer, and a third refraction layer with a third refractive index n3 is present on the second refraction layer. For the amounts (absolute values) of the differences in the refractive indices: |n3-n2|>0.3 and |n2-n1|>0.3, and |n1-nd|>0.3. Here, the values of the refractive indices behave alternatingly: either n1>n2 and n3>n2 or n1<n2 and n3<n2. In addition, at least one of the refractive indices n1, n2, or n3 is greater than 1.9, preferably greater than 2.3.

As a result of the optical interference layers with exactly one, exactly two, or exactly three refraction layers, a homogeneous color impression of the façade element can be achieved with simplified production and lower production costs of the façade element. As a result of two-ply or three-ply layers, the color intensity, in other words, brightness and saturation, i.e., the reflection in a specific narrow wave range can be increased. As a result of relatively high refractive indices, the angular dependence is reduced. Interference layers of layer stacks with more than three layers in combination with the patterned cover plate according to the invention and the embodiments presented also fall within the scope of the invention, but are more complex to produce. With a four-ply layer of refractive layers with alternating high and low refractive indices, for example, the bandwidth of the reflected light can be further reduced with improved transmittance.

In the patterned region of the cover plate, a reflection of the incident light beam occurs with relatively high intensity even outside the glancing angle. The patterned region is, for this purpose, preferably implemented such that there is a reflection haze of more than 50%, particularly preferably more than 90%. The reflection haze can be determined by a commercially available haze meter. According to ASTM D1003, haze is the ratio of the diffuse share of reflected light to the total reflection.

In the façade element according to the invention per the first aspect of the invention, at least one zone is provided in which the segments have a mean roughness of less than 15% of the layer thickness of the optical interference layer on the outer surface by means of which constructive or destructive interference of the reflected light is enabled. For the façade element according to the invention per the second aspect of the invention, an analogous condition applies to the roughness only for the segments of the patterned inner surface on which an optical interference layer is arranged. Advantageously, this zone extends over the entire cover plate. According to one embodiment of the invention, the patterned region has at least one other zone, i.e., (sub-) region, in which the segments have in each case a mean roughness such that interference does not occur on the optical interference layer. For example, the segments have, there, a mean roughness of 50% to 100% of the layer thickness of the interference layer. In these zones, the façade element has no color generated by the optical interference layer.

The opaque back element is fixedly bonded to the cover plate. The back element can itself have a color, wherein the color of the back element influences the overall color of the façade element. In particular, the color of the the back element can be selected to correspond to the opaque background of colored solar modules, in other words, the back element can have a color that corresponds to the optically active solar cells.

Preferably, the back element achromatic, dark, and matt. Then, the color impression of the passive façade elements and its angular dependence can match particularly well the thin-film-module-based colored modules correspondingly produced. These properties can be described as follows:

an L value of a maximum of 50, preferably less than 45, or less than 40;
a chroma $c=(a2+b2)112$ of a maximum of 5, preferably less than 2, or more preferably less than 1.5.

To prevent gloss, the following requirement can also be added:
a reflection haze of at least 90%. Reflection haze is the proportion of diffusely reflected light in the total reflected light.

The back element is, for example, implemented in the form of a coating of the inner surface of the cover plate. The back element can, just as well, be implemented, for example, in the form of a separate body fixedly bonded to the inner surface of the cover plate (not a coating), for example, in panel form. The body can be a loadbearing or a non-loadbearing body and can, as a loadbearing body, be a carrier plate in particular.

According to particularly preferred embodiments of the façade element according to the invention, the back element is implemented as:
a back coating of the cover plate, or
an opaque film that is fixedly bonded to the cover plate by a transparent adhesive, in particular a transparent adhesive film, or
an opaque rigid body that is fixedly bonded to the cover plate by a transparent adhesive, in particular a transparent adhesive film.

The invention further relates to a method for producing a façade element according to the invention per the first aspect of the invention, as is described above.

Here, in a first step a), a flat transparent cover plate that has an outer surface that is intended to face the external environment and an opposite inner surface is provided.

Then, a single second step b1), b2), or b3) is selected from among the following three (alternative) steps and carried out:
b1) Patterning the outer surface of at least in one region, and applying an optical interference layer on the patterned region. In this case, the inner surface is not patterned and no optical interference layer is applied on the inner surface.
b2) Patterning the outer surface at least in one region, applying an optical interference layer on the patterned region of the outer surface, and applying another optical interference layer on the inner surface. In this case, the inner surface is not patterned.
b3) Patterning the outer surface at least in one region, applying an optical interference layer on the patterned region of the outer surface, patterning the inner surface at least in one region, and applying another optical interference layer on the patterned region of the inner surface.

In addition, in a third step c), a back element is mounted on the inner surface of the cover plate. If the second step b1) is carried out, the third step c) can also be carried out before the second step b1). Otherwise, the first, second, and third step are carried out in the order a), b2) or b3), c).

The invention further relates to a method for producing a façade element according to the invention per the second aspect of the invention, as is described above.

Here, in a first step a), a flat transparent cover plate that has an outer surface that is intended to face the external environment and an opposite inner surface is provided.

Then, a single second step b1), b2), b3), or b4) is selected from among the following four (alternative) steps and carried out:

b1) Patterning the outer surface at least in one region, and applying an optical interference layer on the inner surface. In this case, no further optical interference layer is applied on the outer surface. Also, the inner surface is not patterned.

b2) Patterning the outer surface at least in one region, patterning the inner surface at least in one region, and applying an optical interference layer on the patterned region of the inner surface. In this case, no further optical interference layer is applied on the outer surface.

b3) Patterning the inner surface at least in one region, and applying an optical interference layer on the patterned region of the inner surface. In this case, no further optical interference layer is applied on the outer surface. Also, the outer surface is not patterned.

b4) Patterning the inner surface at least in one region, applying an optical interference layer on the patterned region of the inner surface, and applying a further optical interference layer on the outer surface. In this case, the outer surface is not patterned.

In addition, in a third step c), a back element is mounted on the inner surface of the cover plate. The first, second, and third step are carried out in this order.

In the above method, patterning the outer surface or inner surface also includes applying a transparent layer provided with at least one patterned region on the cover plate, which forms the outer surface or inner surface.

The invention further extends to the use of the façade element according to the invention as a (an integral) component of a building envelope (building wall) or a freestanding wall, for example, a privacy wall or a noise barrier, in combination with (photovoltaically active) colored solar modules used as façade elements, in particular those that are described in the unpublished European patent applications EP18186153.5 and EP18186161.8 mentioned in the introduction.

The various embodiments of the invention can be realized individually or in any combinations. In particular, the features mentioned above and hereinafter can be used not only in the combinations indicated but also in other combinations or in isolation without departing from the scope of the present invention.

Figure 4:
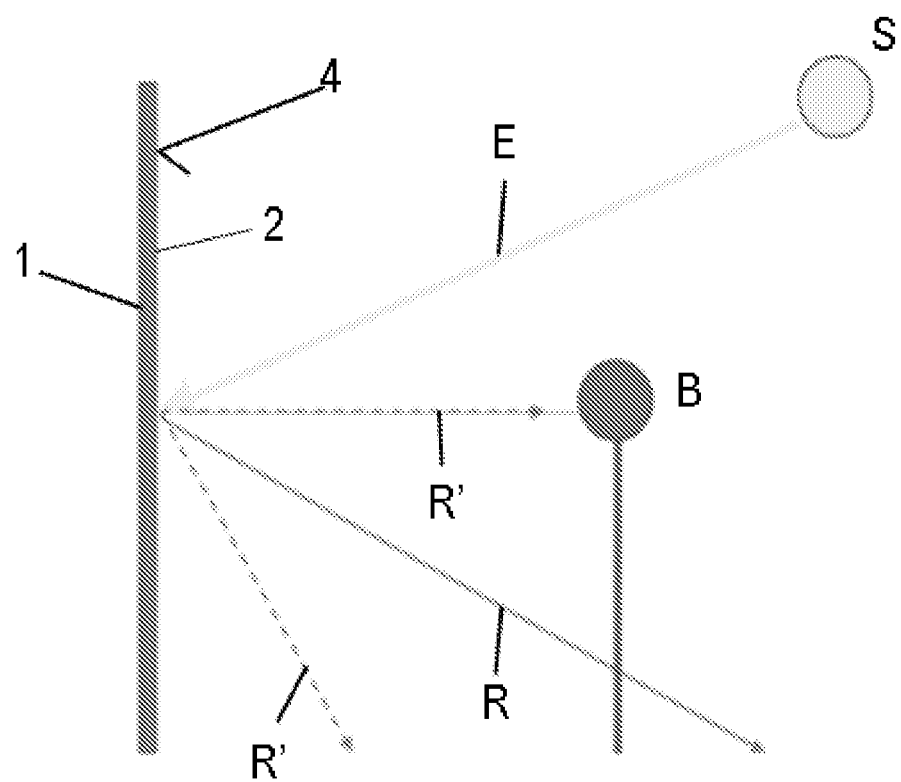
Figure 10:
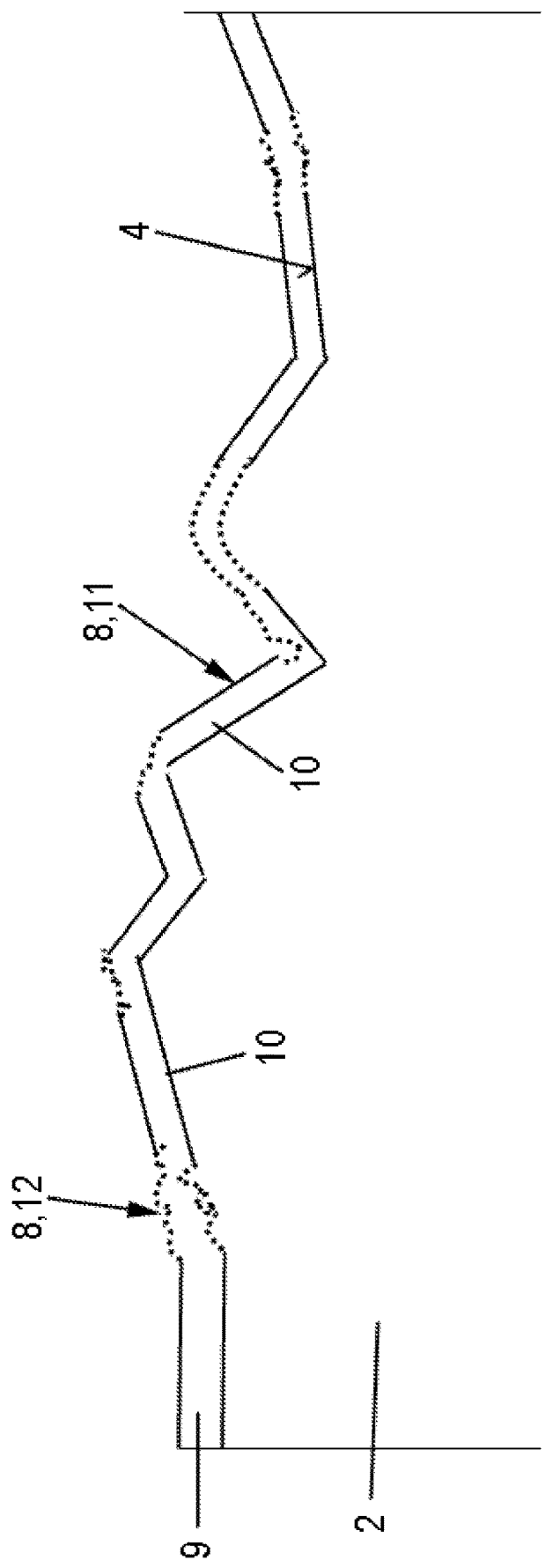
Figure 14:
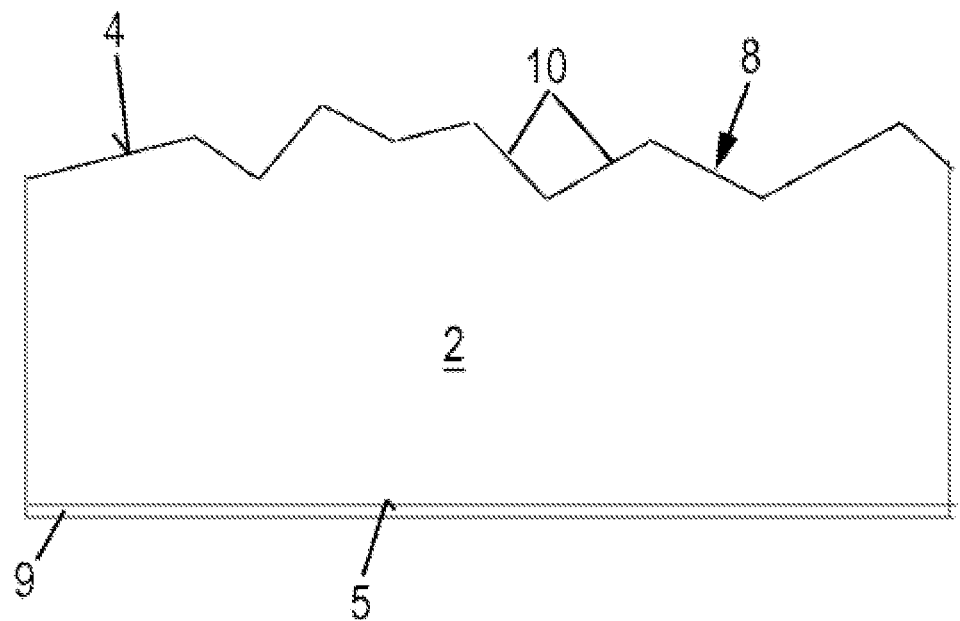
Figure 15:
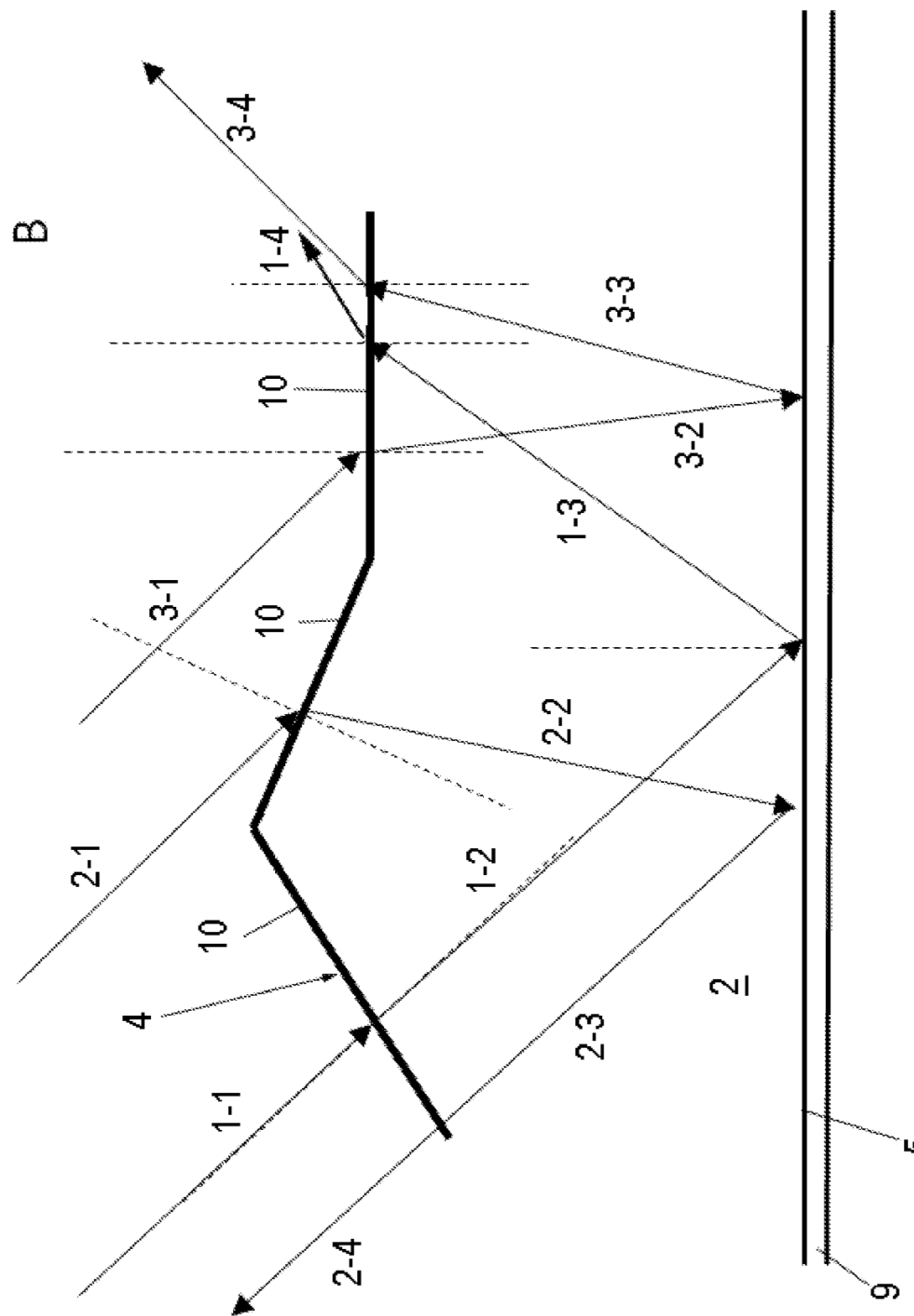
Figure 16:
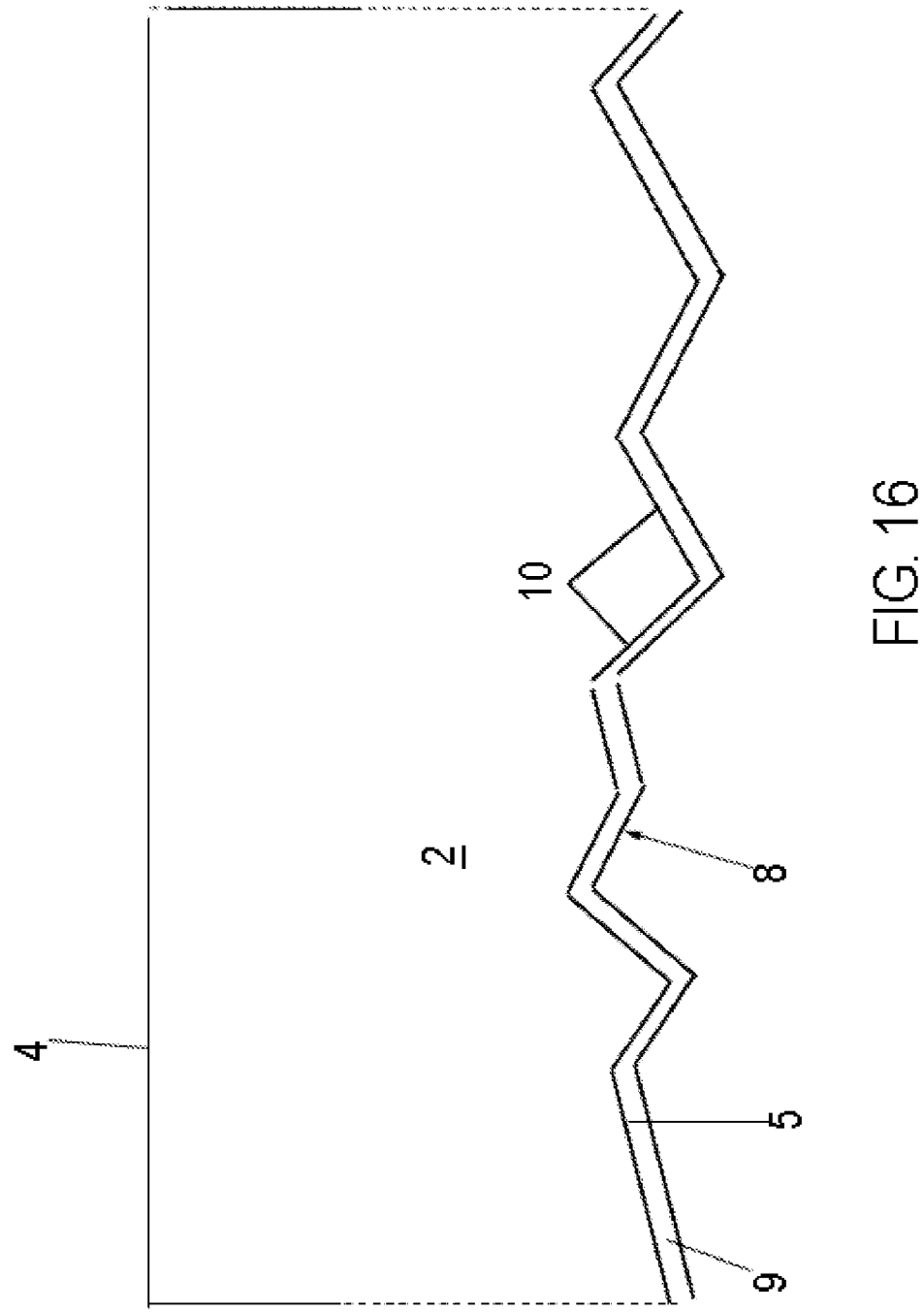
Figure 17:
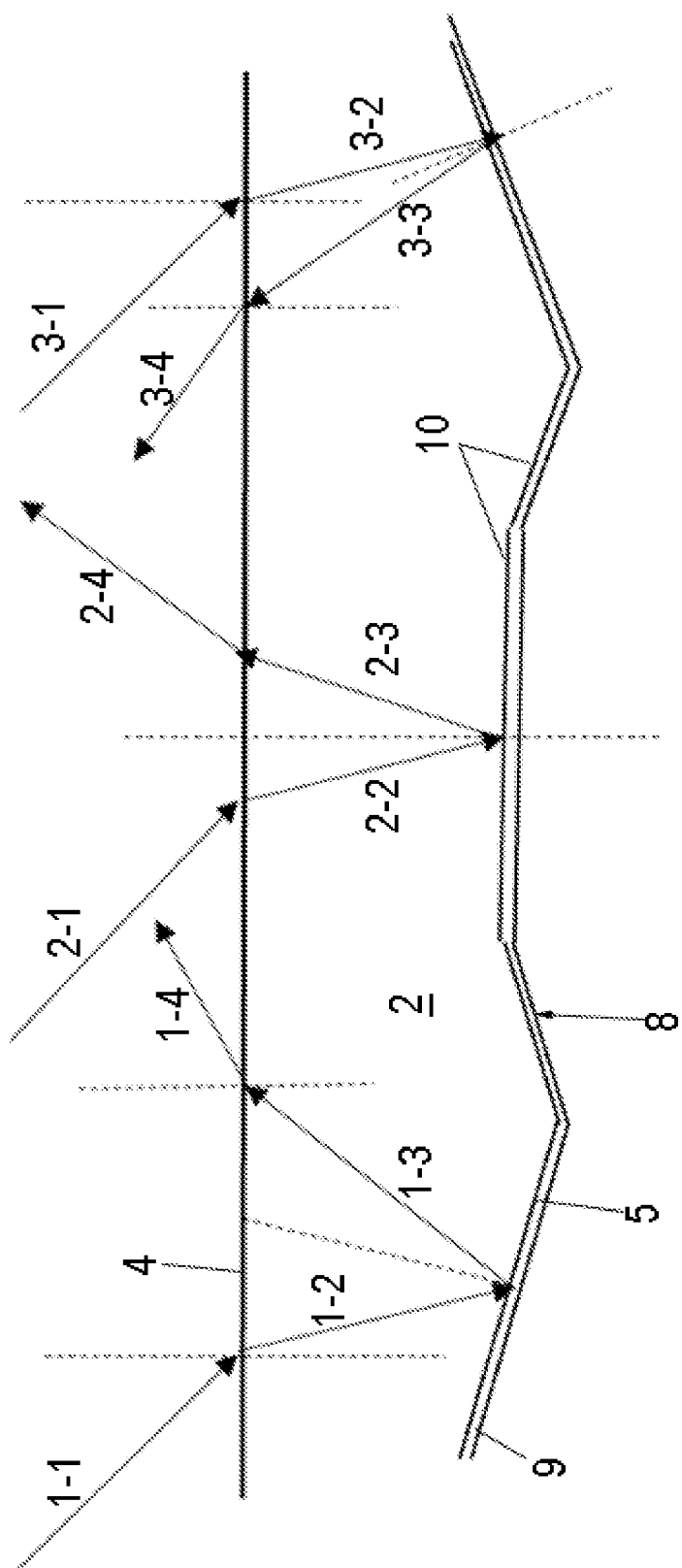
Figure 18:
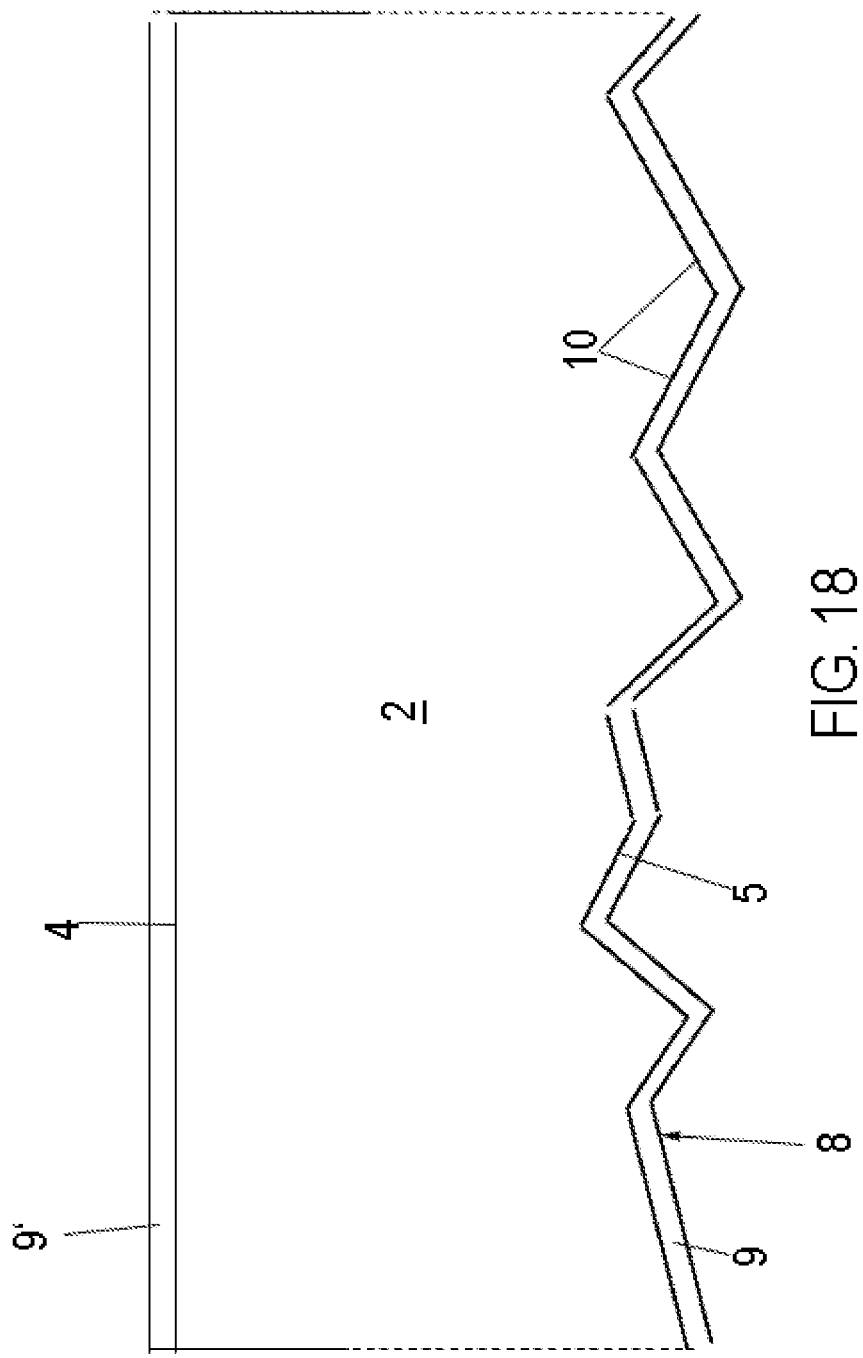
Figure 19:
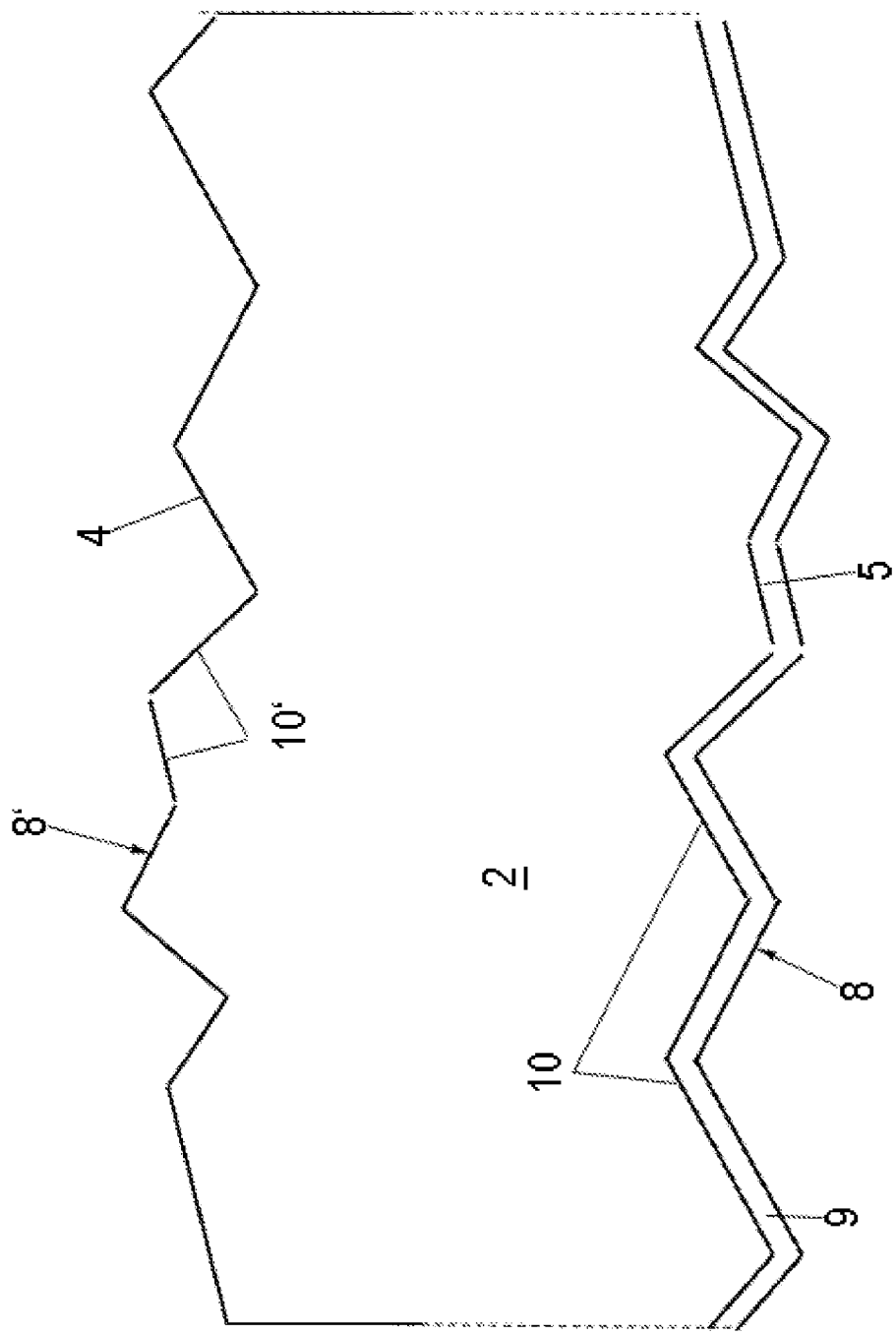
Figure 24:
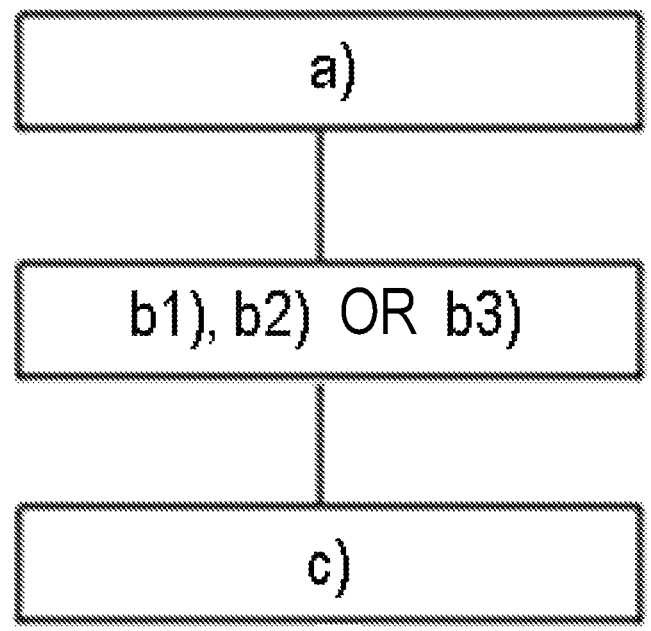
Figure 25:
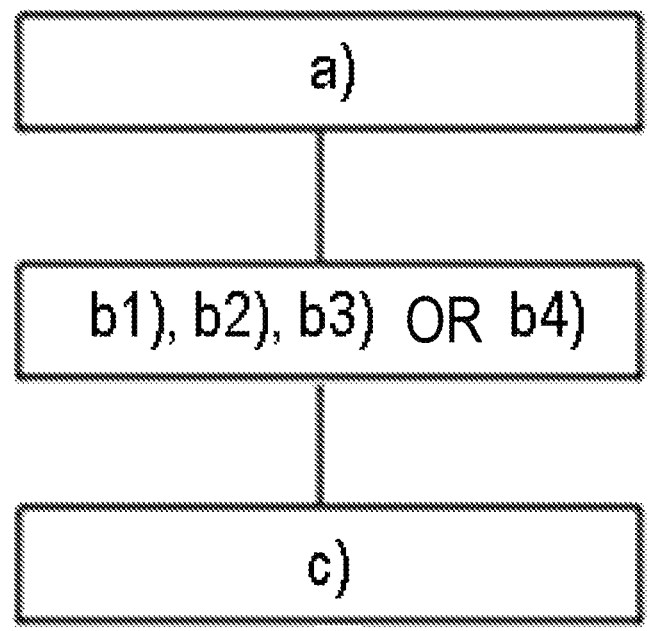

The invention is explained in detail in the following, referring to the accompanying figures. They depict, in simplified, not to scale representation:

FIG. 1-2 the basic structure of different embodiments of the façade element according to the invention in schematic cross-sectional views;

FIG. 3 a schematic cross-sectional view of the cover plate of an embodiment of the façade element according to the invention;

FIG. 4 a schematic representation of typical light relations on a façade element according to the invention;

FIG. 5-8 schematic representations of exemplary light paths during reflection in the patterned region of the cover plate of FIG. 3;

FIG. 9 a schematic representation of the interference of light beams in an optical interference layer;

FIG. 10-11 further embodiments of the cover plate of the façade element according to the invention in schematic cross-sectional views;

FIG. 12 schematic representations of exemplary light paths during reflection on the cover plate in the façade element of FIG. 11;

FIG. 13-14 further embodiments of the cover plate of the façade element according to the invention in schematic cross-sectional views;

FIG. 15 a schematic representation of exemplary light paths during reflection in the patterned region of the façade element of FIG. 14;

FIG. 16 a further embodiment of the cover plate of the façade element according to the invention in a schematic cross-sectional view;

FIG. 17 a schematic representation of exemplary light paths during reflection on the cover plate of the façade element of FIG. 16;

FIG. 18-19 further embodiments of the cover plate of the façade element according to the invention in schematic cross-sectional views;

FIG. 20-23 various exemplary embodiments of the back element of the façade element according to the invention;

FIG. 24 a flowchart for illustrating the method according to the invention for producing a façade element per the first aspect of the invention;

FIG. 25 a flowchart for illustrating the method according to the invention for producing a façade element per the second aspect of the invention;

FIG. 26 a schematic representation of the measurement method for multi-angle colorimetry.

FIG. 1 schematically illustrates the structure of a façade element, referenced as a whole with the number 1, according to an exemplary embodiment of the present invention with reference to a cross-sectional view (section perpendicular to the surface of the façade element). The façade element 1 comprises a transparent cover plate 2 and an opaque back element 3. The cover plate 2 is, for example, a glass pane and is made of a glass, that preferably has low absorption, such as soda lime glass. The cover plate 2 includes an outer surface 4 facing the external environment and an inner surface 5 facing the back element 3. It would also be possible for the cover plate 2 to be implemented as a composite body and consist in particular of a transparent core that is embedded in another transparent material (e.g., sandwich-like), which has the same optical refractive index as the core. The outer surface 4 and inner surface 5 are then formed from this material. This is not shown in detail in FIG. 1. Here, the back element 3 is implemented, for example, in the form of a coating of the inner surface 5, which extends over the entire inner surface 5. The coating can consist of one or a plurality of layers. Used as coating can be, for example, lacquers, polymer layers, polymer films, or inorganic layers made of metal oxide powders, carbon, or semiconductor materials.

The layer thickness of the back element 3 can be freely selected, so long as the desired optical properties of the coating are ensured. If necessary, the back element 3 can be protected against environmental influences by a back covering, implemented, for example, in the form of a further coating or film. The back element 3 is non-loadbearing, such that the cover plate 2 must fulfill the specific requirements for use as façade element 1. In particular, the mechanical load capacity and the capability of suitable connection to the building structure must be ensured, for example, through the use of frames, brackets, or back rails. For this purpose, the cover plate 2 is preferably made of enhanced glass, such as, thermally toughened glass, so-called "single-pane safety glass" (ESG), or annealed glass (TVG). The coating is opaque and can, for example, have a pre-definable color such that by means of the background color of the coating, an overall color impression of the façade element is generated as desired. It is, for this purpose, equally possible for the back element to be achromatic, dark, and matt.

Reference is now made to FIG. 2, wherein the structure of another exemplary embodiment of the façade element 1 according to the present invention is illustrated schematically using a cross-sectional view. In order to avoid unnecessary repetitions, only the differences relative to the exemplary embodiment of FIG. 1 are explained and, otherwise, reference is made to the statements above. Accordingly, the back element 3 is not a coating, but, rather, a separate body with a defined spatial shape that is present independent of the cover plate 2 and is fixedly bonded to the inner surface 5 of the cover plate 2, here, for example, by means of a transparent adhesive layer 6 (e.g., laminating film). In principle, any suitable joining technique can be used for the fixed bonding of the cover plate 2 and the back element 3, for example, gluing or grouting. Advantageous are joining methods in which the transparent material used for the joining (for example, adhesive layer, laminating film, or grout) has a refractive index greater than 1.4 and less than 1.6. Otherwise, the resulting color of the façade element 1 can possibly be undesirably altered.

The back element 3 is implemented here, for example, in the form of a flat panel that has a contact surface 7 for the fixed bonding to the inner surface 5 of the cover plate 2. The back element 3 completely covers the inner surface 5. The cover plate 2 and the panel-like back element 3 form a composite body. The back element 3 implemented here as a separate body can be loadbearing or non-loadbearing. In the present exemplary embodiment, the panel-like back element 3 is loadbearing (carrier plate) and has mechanical properties suitable for this purpose to ensure, by itself or in conjunction with the cover plate 2, the loadbearing capacity of the façade element 1. The façade element thus produced can be connected in a simple manner to the building structure and must, as a whole, satisfy the requirements as a façade element in the building envelope.

The panel-like back element 3 is made, for example, of a fiber composite, glass, stone, metal, or ceramic and can be coated in particular with a color, for example, a ceramic screen printing ink or organic glass color or a suitable inorganic thin film to provide a desired background color. It is also possible for the material of the back element 3 itself to already have a desired color. For example, the back element 3 is made of a glass colored in the glass matrix. Also possible for achieving a particularly homogeneous color impression of a façade in combination with CIGS thin-film solar modules is the use of CIGS thin films that developed as waste from series production. A glass back element 3 can be bonded to a glass cover plate 2 in a simple manner using prior art laminating methods. For example, the back element 3 is a metal sheet, a metal foil, or is made of a metal composite material. The metal sheet or the metal foil can, for example, be treated by anodizing for coating such that the desired optical properties develop. The back element 3 can equally be made of construction materials suitable for outdoor use, for example, fiber cement panels, concrete panels, textile-reinforced or fiber-reinforced concrete shells, wood/ wood fiber materials, plastics, or other nonmetallic composite materials. The surface of the material can be designed with the coloring technologies corresponding to the material used such that the desired optical properties result.

Depending on the embodiment of the façade element 1, the outer surface 4 and/or the inner surface 5 of the cover plate 2 is patterned (e.g., by etching, sandblasting, or rolling during the drawing process) and has at least one optical interference layer, which is not shown in FIG. 1 and FIG. 2. This is explained in detail below.

The structure of the façade element 1 of FIG. 1 or FIG. 2 can be used equally in façade elements per the first aspect and second aspect of the invention.

FIG. 3 illustrates an embodiment of the façade element 1 according to the invention per the first aspect of the invention, wherein only the cover plate 2 with exemplary patterning is depicted. The façade element can in particular be implemented as in FIG. 1 or FIG. 2. Accordingly, the outer surface 4 of the cover plate 2 is patterned in a region 8, which extends over the entire outer surface 4 in the present example, in other words, the outer surface 4 and the patterned region 8 are identical. An optical interference layer 9 is arranged directly on the outer surface 4. In the patterned region 8, the outer surface 4 is provided with a height profile that has hills and valleys. Here, more than 50% of the outer surface 4 consists of planar segments 10, whose planes are in each case inclined relative to the plane of the cover plate 2, i.e., have a non-zero angle relative to the plane of the cover plate 2. The segments 10 have in each case a segment area of at least 1 µm$^2$ and a mean roughness of less than 15% of the layer thickness d of the optical interference layer 9. A mean height difference between the highest points (hills) and lowest points (valleys) of the outer surface 4 is at least 2 µm and, for example, a maximum of 20% of the thickness of the cover plate 2. Relative to the plane of the cover plate 2, at least 20% of the segments have an inclination angle in the range from greater than 0° to a maximum of 15°; at least 30% of the segments have an inclination angle in the range from greater than 15° to a maximum of 45°; and less than 30% of the segments 10 have an inclination angle greater than 45°. In the exemplary embodiment of FIG. 3, all segments have an inclination angle of a maximum of 45°.

The optical interference layer 9 is thin and has a layer thickness, for example, in the range from 0.1 to a few (for example, 2) micrometers. Also, the optical interference layer 9 has a refractive index n greater than 1.7, preferably greater than 2.0, and particularly preferably greater than 2.3, as well as the least possible absorption with regard to the incident light. The optical interference layer 9 can be single-ply or multiply, in other words, can consist of one or a plurality of refraction layers. Each refraction layer has a specific refractive index and is made of the same material. For example, the optical interference layer 9 is made of MgO, SiONx, Si$_3$N$_4$, ZrO$_2$, TiOx, and/or SiC. The electrical conductivity of the individual refraction layers, in particular of the optical interference layer 9, should be as low as possible.

In the following, the operating principle of the patterning of the outer surface 4 of the cover plate 2 is described in detail. Consider first, FIG. 4, wherein, by way of example, typical light relations with a façade element 1 are illustrated. According to it, light from the sun S strikes directly on the cover plate 2 and is reflected in the glancing angle. The incident light beam E and the light beam R reflected in the glancing angle are depicted. In addition to the reflected light beam R, the incident light is also scattered diffusely outside the glancing angle. Two diffusely scattered light beams R' are depicted by way of example. The color effect is produced by reflection, scattering, and interference. When a viewer B stands in front of the façade element 1 and looks in front of himself at a right angle to the cover plate 2, the directly reflected light R strikes his eye only in the rarest of cases (in other words, the viewer is not usually within the glancing angle). This is illustrated in FIG. 4, where the viewer B is situated outside the glancing angle and sees only the diffusely scattered light beam R'. In the case of a smooth surface without a patterned region 8, the intensity of the diffusely scattered light R' is relatively low and has strong angular dependence. Only when the diffusely scattered share is adequately large is there a clear color with satisfactory intensity (brightness, L value).

The basic principle of the operation of the inclined segments 10 of the patterned region 8 is illustrated in FIG. 5, wherein, by way of example, the various light paths are depicted for a viewer B who is looking at a right angle to the glass surface or outer surface 4 of the façade element 1. Depicted are three segments 10 with different inclinations relative to the schematically illustrated plane GE of the cover plate 2, as well as the light beams E striking the segments 10, which are reflected to the viewer B by the segments 10 in each case in the local glancing angle (reflected light beams R). The center segment 10 is arranged parallel relative to the plane GE, with the incident light beam E striking the segment 10 at a right angle and being reflected to the viewer B at a right angle (reflected beam R). For the center segment 10, the glancing angle and the local glancing angle are identical. In the case of the two adjacent segments 10, the incident light beams E have in each case a non-zero angle relative to the surface normal of the plane GE and likewise strike the viewer B in the local glancing angle. Due to the different inclinations of the segments 10, light from different directions is in each case reflected in the local glancing angle of the segments 10 to the viewer B looking at a right angle at the module surface. In the exemplary embodiment of FIG. 5, the angle of incidence and the angle of reflection equal a maximum of 45°.

FIG. 6 depicts a situation in which the viewer B is looking at an angle of 45° relative to the surface normal of the plane GE of the cover plate 2. As in FIG. 5, by way of example, three segments 10 with different inclinations relative to the plane GE of the cover plate 2 are depicted, as well as the light beams E incident in each case on the segments 10, which are reflected to the viewer B by the segments 10 in the local glancing angle (reflected light beams R). Due to the different inclinations of the segments 10, light is reflected from different directions in each case in the local glancing angle to the viewer B looking at the module surface. In the exemplary embodiment of FIG. 6, the angles of incidence and reflection are 67.5° at a maximum. In principle, with relatively large values of the glancing angle, the reflected light is blueshifted. This blue shifting can be reduced by a higher refractive index of the optical interference layer. With relatively steep surface inclinations, multiple reflection on adjacent facets can also occur.

FIG. 7 depicts a situation in which the light source and, correspondingly, the incident light beams are always inclined at an angle of 45° relative to the plane GE of the cover plate 2. The viewer B observes the surface of the façade element 1 at different angles. The angle data in FIG. 7 are to be understood as follows: angle of incidence (relative to the plane GE of the cover plate 2)/viewing angle or reflection angle (deviation of the glancing angle relative to the surface normal of plane GE). The degree sign "°" is not indicated. FIG. 7 depicts, by way of example, four segments 10 with different inclinations relative to the plane GE. In only one segment 10, whose plane is parallel relative to the plane of the cover plate 2, is the viewer B situated in the glancing angle relative to the plane GE: 45/0. This means that the incident light beam has an angle of 45° relative to the plane GE; the reflected light beam, an angle deviation zero from the glancing angle. With the other segments 10, the viewer B is situated outside the glancing angle (with reference to the plane GE of the cover plate 10). With the two left segments 10 (45/90, 45/45), the viewer views the surface of the façade element 1 at an angle of 90° or 45° relative to the glancing angle, with the light striking at an angle of 45° relative to the plane GE. With the right segment 10 (45/−15), the viewer is situated at an angle of −15° relative to the glancing angle. Due to the differently inclined segments 10 and the resultant reflection in the local glancing angle, light is then reflected to the viewer B with sufficient intensity even when the viewer is not situated in the glancing angle relative to the plane GE of the cover plate 2.

FIG. 8 depicts a situation in which the viewer B always observes the surface of the façade element 1 at an angle of 45° relative to the module surface or plane GE of the cover plate 2. FIG. 8 depicts, by way of example, four segments 10 with different inclinations relative to the plane GE. Only in one segment 10, whose plane is parallel relative to the plane GE, is the viewer B situated in the glancing angle: 45/0. With the other segments 10, the viewer B is situated outside the glancing angle. With the two left segments 10 (45/90, 45/45), the viewer B views the surface of the façade element 1 at an angle of 45°, with the light striking in a deviation of 90° or 45° relative to the glancing angle. With the right segment 10 (45/−15), the light strikes at an angle of −15° relative to the glancing angle. Due to the differently inclined segments 10 and the resulting reflections in the local glancing angle, light is then reflected to the viewer B with sufficient intensity even when light strikes outside the glancing angle.

In the façade element 1 according to the invention, a homogeneous color impression in a pre-definable wavelength range can be achieved by means of the patterning of the outer surface 4 of the cover plate 2 in combination with the coloring optical interference layer 9, with the color impression far less angle-dependent in comparison to a non-patterned surface.

FIG. 9 illustrates the reflection on the optical interference layer 9 with the layer thickness d. The incident light beam E is reflected both at the atmosphere/interference layer interface (R1) and at the interference layer/cover plate interface (R2). If the path difference of the two light beams R1, R2 corresponds to a multiple of the wavelength of the incident light beam, constructive interference occurs; with a path difference of a multiple of the half wavelength, destructive interference occurs. In the case of illumination with white light, the optical interference layer 9 thus acts as a color filter, since constructive interference, dependent on the refractive index n and the layer thickness d, only occurs for light of a suitable wavelength. Here, a is the angle of the reflected beams R1, R2, relative to the surface normal. The light beams R' illustrate, by way of example, the reflected light outside the glancing angle, which can occur in the patterned region 15, when the roughness of the interface between interference layer/cover plate is too great. To satisfy the interference condition, it is necessary for the scattering centers to be, in each case, smaller than the wavelength and the layer thickness. This can be achieved by means of the minimal areas of the segments claimed according to the invention and their maximum roughness. This effect is utilized according to an embodiment of the invention (cf. FIG. 10).

If the outer surface 4 of the cover plate 2 is coated with an optical interference layer 9, made of an inorganic, chemically inert, and hard layer, such as with $Si_3N_4$, there is high scratch resistance, chemical stability, dirt-repellent action for the façade element 1. Through the use of photocatalytic layers such as $TiO_2$, there can, additionally, be a self-cleaning effect. Climatic tests have also demonstrated that interference layers made of materials such as $Si_3N_4$ or $TiO_2$ also prevent the corrosion of a glass cover plate by moist heat.

Reference is now made to FIG. 10, wherein another embodiment of the façade element 1 according to the invention per the first aspect of the invention is illustrated, wherein only the cover plate 2 is shown. In order to avoid unnecessary repetitions, only the differences relative to the embodiment of FIG. 3 are described; and, otherwise, reference is made to the statements above. In this embodiment, the patterned region 8 of the outer surface 4 has first zones 11 and second zones 12. Here, the first zones 11 are implemented such that the segments 10 have a mean roughness that is less than 15% of the layer thickness d of the optical interference layer 9 on the outer surface 4. In the embodiment of FIG. 3, this is true for the entire patterned region 8. In contrast, the mean roughness in the second zones 12 is great enough that interference is prevented in the optical interference layer 9. For example, the mean roughness of the segments 10 in the second zones 12 is more than 50% of the layer thickness of the optical interference layer 9. The façade element 1 has, consequently, in the first zones 11, a homogeneous color, resulting from the color filtering action of the optical interference layer 9. In the second zones 12, the optical interference layer 9 has, as a result of the lack of constructive interference, no color filtering effect and thus there is essentially a surface that corresponds to the façade element without an optical interference layer 9. The façade element 1 can thus be optionally provided with a homogeneous color in the pre-definable first zones 11. FIG. 10 depicts the second zones 12 schematically by greater roughness.

FIG. 11 illustrates another embodiment of the façade element 1 according to the invention per the first aspect of the invention, wherein only the cover plate 2 is shown. In order to avoid unnecessary repetitions, only the differences relative to the embodiment of FIG. 3 are described; and, otherwise, reference is made to the statements above. Accordingly, the façade element 1 has, on the outer surface 4 of the cover plate 2 on the patterned region 8, a first optical interference layer 9 as well as, on the inner surface 5 of the cover plate 2, a second optical interference layer 9'. The inner surface 5 of the cover plate 2 is not patterned, i.e., has no patterned region 8 analogous to the outer surface 4. The inner surface 5 is smooth within the limits of production imprecisions. The second optical interference layer 9' has a layer thickness d' and an optical refractive index n', which can be the same as those of the first optical interference layer 9, but need not necessarily be the same. As a result of the second optical interference layer 9', the color effect is further strengthened. With reference to the embodiment of FIG. 3, this yields a second reflexion source with color filtering action since the refractive index of the second optical interference layer 9' between the cover plate 2 (e.g., glass) and the adhesive layer 6 is greater than that of the cover plate 2 (e.g., glass) and the adhesive layer 6. As a result of the light refraction, the entry angle is smaller with the second reflexion. Since the light passes through an optical interference layer a total of three times, the light that reaches the viewer is more strongly filtered. In particular, the layer thicknesses d, d' and the refractive indices n, n' of the two optical interference layers 9, 9' can also be significantly different from one another. In the case of coating with significantly different optical thicknesses n*d or n'*d', mixed colors can be generated since the first optical interference layer 9 then generates a different reflection spectrum than the second interference layer 9' and the light reflected by the second interference layer 9', upon again passing through the first optical interference layer 9, is overlaid. Thus, colored modules with a variety of colors and high angular stability can be generated in a very simple and economical manner.

FIG. 12 illustrates, in a highly simplified manner, the beam path of the incident light E and the reflected light R1, R2. FIG. 12 does not show the patterning of the cover plate 2. Only a single beam path is depicted, here in the glancing angle with reference to the plane of the cover plate. As can be seen, the light, which has passed through the first interference layer 9, is refracted in the cover plate 2 (e.g., glass), is reflected a second time on the second interference layer 9', and is thereby filtered by interference. Upon exiting the cover plate 2, it passes through the interference layer 9 such that interference layers are passed through three times.

FIG. 13 illustrates another embodiment of the façade element 1 according to the invention per the first aspect of the invention, wherein only the cover plate 2 is shown. In order to avoid unnecessary repetitions, only the differences relative to the embodiment of FIG. 11 are described; and, otherwise, reference is made to the statements above. Accordingly, the façade element 1 has, on the outer surface 4 of the cover plate 2, a first patterned region 8; and on the inner surface 5 of the cover plate 2, a second patterned region 8', wherein a first optical interference layer 9 is arranged on the first patterned region 8 and a second optical interference layer 9' is arranged on the second patterned region 8'. The two patterned regions 8, 8' can be implemented the same or different. Likewise, the two optical interference layers 9, 9' can be implemented the same or different, wherein in particular the layer thicknesses d, d' and the refractive indices n, n' of the two optical interference layers 9, 9' can be different from one another. When the same optical thickness n'*d' is selected for the two optical interference layers 9, 9', the color of the façade element 1 can be intensified. In the case of coating with significantly different optical thicknesses, mixed colors can be generated.

Common to all embodiments described above per the first aspect of the invention in FIGS. 3, 11, and 12 is the fact that already when the light strikes the patterned outer surface with an interference layer, a color with high intensity and little angular dependence develops as a result of reflection and interference even outside the glancing angle. The additional interference layers and/or patterning in the embodiments of FIGS. 11 and 12 on the inner surface can further strengthen this effect.

FIG. 14 illustrates, with reference to an enlarged detail of the cover plate 2 of the façade element 1, an embodiment of the façade element 1 according to the invention per the second aspect of the invention. In order to avoid unnecessary repetitions, only the differences relative to the embodiment of FIG. 3 are described, and, otherwise, reference is made to the statements above. Accordingly, the outer surface 4 of the cover plate 2 is patterned in one region 8, which extends, in the present example, over the entire outer surface 4, in other words, the outer surface 4 and the patterned region 8 are identical. An optical interference layer 9 is arranged directly on the inner surface 5 of the cover plate 2. The inner surface 5 has no patterning and is smooth within the limits of production imprecisions. No optical interference layer is situated on the outer surface 4. There is no requirement for the roughness for the segments 10 of the patterned region 8 of the outer surface 4 of the façade element 1 of FIG. 14.

Referring to FIG. 15, the function of the patterned outer surface 4 in combination with the inside interference layer 9 according to the embodiment of FIG. 14 is explained in detail. Depicted there, by way of example, are various light paths for differently inclined segments 10 of the cover plate 2. By way of example, three segments 10 are depicted, wherein the right segment 10 is parallel to the plane of the cover plate 2 and the two other segments 10 have a non-zero angle relative to the plane of the cover plate 2. The reflection of the light beams on the interference layer 9 is depicted in a simplified manner. The reflection on the interference layer 9 is explained in connection with FIG. 6. FIG. 15 depicts the light paths for three light beams, which strike the differently inclined segments 10 of the outer surface 4 of the cover plate 2, in each case at one and the same angle relative to the normal of the plane of the cover plate 2. The respective perpendicular to the segments 10 is drawn dashed. Due to the differently inclined segments 10, the light beams are reflected differently. A first light beam 1-1 strikes a segment 10, crosses through the cover plate 2 as a refracted light beam 1-2, is reflected as light beam 1-3 by the interference layer 9 (in the glancing angle), and exits the cover plate 2 to the external environment as a refracted light beam 1-4. The light beam 1-4 ultimately reflected by the cover plate 2 has a different angle relative to the normal to the plane of the cover plate 2 than the incident light beam 1-1 such that there is no reflection in the glancing angle, but rather there is scattering. Correspondingly, a second light beam 2-1 strikes a different segment 10, crosses through the cover plate 2 as a refracted light beam 2-2, is reflected as light beam 2-3 by the interference layer 9, and and exits the cover plate 2 to the external environment as a refracted light beam 2-4. The reflected light beam 2-4 exits the cover plate 2 almost directly opposite the incident direction of the light beam 2-1, which is likewise a scattering process and not reflection in the glancing angle. A third light beam 3-1 strikes another segment 10, crosses through the cover plate 2 as a refracted light beam 3-2, is reflected as light beam 3-3 by the interference layer 9, and exits the cover plate 2 to the external environment as a refracted light beam 3-4. This segment 10 is parallel to the plane of the cover plate such that the light beam 2-4 is reflected in the glancing angle. Essential here is the fact that as a result of those segments 10 that are inclined relative to the plane of the cover plate 2, due to the refraction on the respective segment 10 and subsequent reflection on the interface with the interference layer 9 and further refraction on the patterned surface, overall a strong reflection even outside the glancing angle (with reference to the plane of the cover plate 2) occurs such that in combination with the interference layer 9, a homogeneous color effect of the reflected light is achieved. FIG. 15 depicts, by way of example, the position of a viewer B, who is situated outside the glancing angle. Due to the relatively strongly (diffusely) scattering cover plate 2 with outer patterning and an inside interference layer, there are, for various viewing angles outside the glancing angle, mostly suitable light paths that have passed through the interference layer. This results in a color impression that is far less direction-dependent than is the case with prior art modules without a patterned region 8.

Reference is now made to FIG. 16, wherein another embodiment of the façade element 1 according to the invention per the second aspect of the invention is illustrated, wherein only the cover plate is depicted. In order to avoid unnecessary repetitions, only the differences relative to the embodiment of FIG. 14 are described, and, otherwise, reference is made to the statements above. Accordingly, the façade element 1 has, on the inner surface 5 of the cover plate 2, a patterned region 8, with an optical interference layer 9 arranged on the patterned region 8. The optical interference layer 9 is thin and follows the surface of the patterned region 8. The patterned region 8 and the optical interference layer 9 can in each case be implemented analogously to those of the embodiment of FIG. 14. The outer surface 4 of the cover plate 2 has no patterned region 8 and is smooth within the limits of production imprecisions. Also, no optical interference layer is arranged on the outer surface 4. In contrast to the segments 10 of the patterned region 8 of the outer surface 4 of the embodiment of FIG. 14, the optical interference layer 9 is situated on the patterned region 8 of the inner surface 5 such that the segments 10 must satisfy the condition according to which the segments 10 of the patterned region 8 of the inner surface 5 are flat in each case, have a segment area of at least 1 $\mu m^2$, and have a mean roughness of less than 15% of a layer thickness of the optical interference layer 9 on the inner surface 5.

FIG. 17 depicts analogously to FIG. 15, by way of example, three different light paths for the embodiment of the cover plate 2 of FIG. 16. The reflection of the light beams on the interference layer 9 is again depicted in a simplified manner. The statements relative to FIG. 6 apply analogously. Due to the differently inclined segments 10, the light beams are reflected differently by the cover plate 2. A first light beam 1-1 strikes the outer surface 4 of the cover plate 2, crosses through the cover plate 2 as a refracted light beam 1-2, is reflected as light beam 1-3 by a segment 10 inclined relative to the plane of the cover plate 2, and exits the cover plate 2 to the external environment as a refracted light beam 1-4. Correspondingly, a second light beam 2-1 strikes the outer surface 4 of the cover plate 2, crosses through the cover plate 2 as a refracted light beam 2-2, is reflected as light beam 2-3 by a segment 10 parallel to the plane of the cover plate 2, and exits the cover plate 2 to the external environment as a refracted light beam 2-4. Correspondingly, a third light beam 3-1 strikes the outer surface 4 of the cover plate 2, crosses through the cover plate 2 as a refracted light beam 3-2, is reflected as light beam 3-3 by a segment 10 inclined relative to the plane of the cover plate 2, and exits the cover plate 2 to the external environment as a refracted light beam 3-4. Only for the center segment 10 is the condition entry angle=exit angle, i.e., reflection in the glancing angle, met for the entering light beam 2-1 and the exiting light beam 2-4. The other light beams R reflected by the segments 10 in each case in the local glancing angle, which does not, however, correspond to the glancing angle of the plane of the cover plate 2 such that relatively strong scattering occurs. In connection with the optical interference layer 9, a homogeneous color effect with little directional dependence can be obtained for the façade element 1.

FIG. 18 illustrates another embodiment of the façade element 1 according to the invention per the second aspect of the invention, wherein only the cover plate 2 is depicted. In order to avoid unnecessary repetitions, only the differences relative to the embodiment of FIG. 16 are described, and, otherwise, reference is made to the statements above. Accordingly, the façade element 1 has, in addition to the optical interference layer 9 on the patterned region 8 of the inner surface 5 of the cover plate 2, another optical interference layer 9' directly on the outer surface 4 of the cover plate 2. The outer surface 4 is not patterned, i.e., has no patterned region 8 analogous to the inner surface 5. Instead, the outer surface 4 is smooth within the limits of production imprecisions. The two interference layers 9, 9' can have the same or a different optical refractive index as well as the same or a different layer thickness. If the same optical thickness n*d is selected for both optical interference layers 9, 9', the color of the façade element 1 can be intensified since the light reaching the viewer passes through an optical interference layer a total of three times, and is, consequently, more strongly filtered. In the case of coating with significantly different optical thicknesses, mixed colors can be generated.

If the outer surface 4 of the cover plate 2 is coated with an optical interference layer 9' that is made of an inorganic, chemically inert, and hard layer, such as $Si_3N_4$, there is high scratch resistance, chemical stability, and dirt-repellent action for the façade element 1. Through the use of photocatalytic layers such as $TiO_2$, there can, additionally, be a self-cleaning effect.

Such an additional layer arranged on the outer surface 4 can also be a thin antireflection layer that has an optical refractive index that is less than that of the cover plate 2. By this means, the substantially white reflection of the cover plate 2 (for example, glass) is prevented and the saturation level of the colors increases.

FIG. 19 illustrates another embodiment of the façade element 1 according to the invention per the second aspect of the invention, wherein only the cover plate 2 is depicted. In order to avoid unnecessary repetitions, only the differences relative to the embodiment of FIG. 16 are described, and, otherwise, reference is made to the statements above. Accordingly, the inner surface 5 of the cover plate 2 of the façade element 1 has a patterned region 8, on which an optical interference layer 9 is arranged. The outer surface 4 of the cover plate 2 also has a patterned region 8'. No optical interference layer is arranged on the outer surface 4. The two patterned regions 8, 8' can be the same or different from one another. In the exemplary embodiment of FIG. 19, all segments 10 have an inclination angle of a maximum of 45°. In contrast to the segments 10 of the patterned region 8 of the inner surface 5, there is no requirement for roughness for the segments 10' of the patterned region 8' of the outer surface 4 of the façade element 1 of FIG. 19.

Such an additional layer arranged on the outer surface 4 can also be a thin, color-neutral antireflection layer that has an optical refractive index that is smaller than that of the cover plate 2. By this means the substantially white reflection of the cover plate 2 (e.g., glass) is prevented and the saturation level of the colors increases. An additional layer arranged on the outer surface 4 can, however, also have the same optical refractive index as the cover plate 2. In this case, the layer serves only for protection of the cover plate 2 against moisture and other corrosive components of the air. It has been demonstrated that satinized glasses produced by etching are more sensitive to moist heat than planar or rolled glasses. In the case of etched soda lime glass, the additional layer can, for example, be a thin sputtered $SiO_2$ layer.

Common to the embodiments of the second aspect of the invention described in FIGS. 14, 16, 18, and 19 is the fact that the light must pass at least once through the cover plate and must be reflected on the inside interference layer in order to achieve, after exit from the outer surface, the desired chromaticity with improved angular stability.

In principle, the façade element 1 can be mounted on a façade by any suitable attachment technique, for example, back rails mounted on the back element 3 (e.g., by gluing), drilled point holders, clamping bars, etc. in particular, the back element 3 can be used for attachment suited to the substructure system used. Frequently, in ventilated curtain façades, anchoring systems are used wherein the joining is accomplished by form locking.

Figure 20:
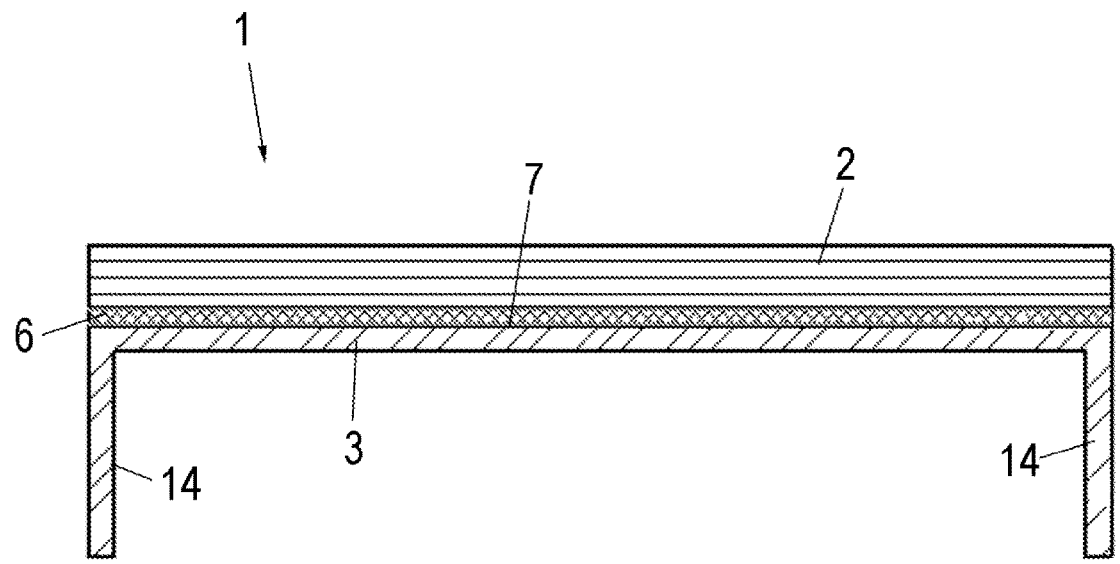

FIG. 20 depicts an exemplary embodiment in which a loadbearing back element 3 implemented, for example, in the form of a metal sheet is mounted on the cover plate 2 by means of a transparent adhesive layer 6 (film, casting resin). The metal sheet is U-shaped and has, in addition to a panel-shaped section that has a contact surface 7 for gluing, protruding supports 14 on the back that can be used to attach the façade element 1. The metal sheet can, in particular, be made of a metal composite material.

Figure 21:
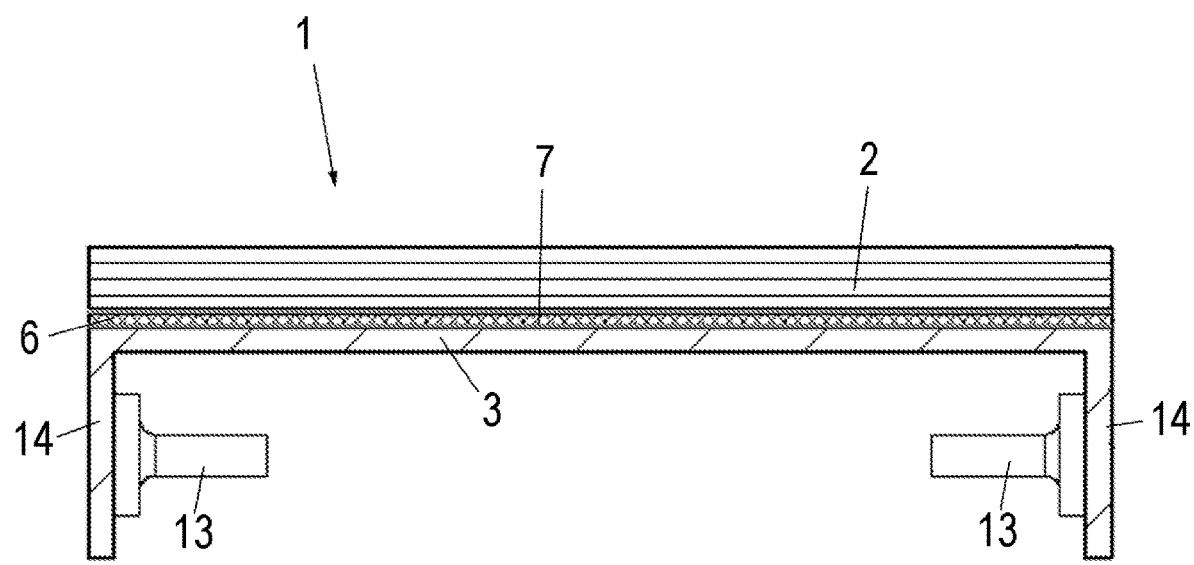

FIG. 21 depicts a variant of the embodiment of FIG. 20 in which, on the back element 3 implemented as a metal sheet, attachment elements 13 are in each case mounted by a mechanical connection, such as gluing, screwing, or riveting on the supports 14. By means of the attachment elements 13, the façade element 1 can be connected, for example, form-lockingly to a support structure, in order to integrate the façade element 1 into a façade.

Figure 22:
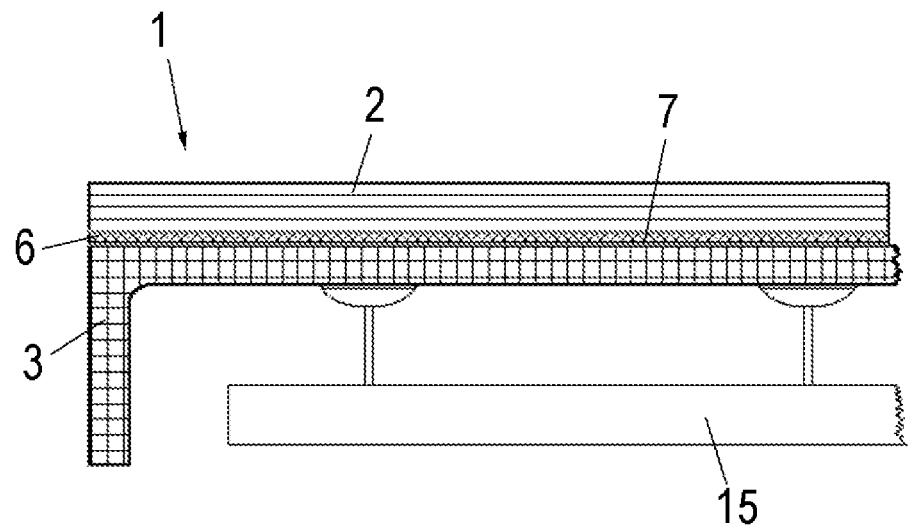

FIG. 22 illustrates a another variant. Here, the back element 3 is implemented in the form of a loadbearing, fiber-reinforced concrete shell, on the back of which a suspension 15 is mounted. The façade element 1 can be attached in a simple manner on a support structure via the suspension 15.

Figure 23:
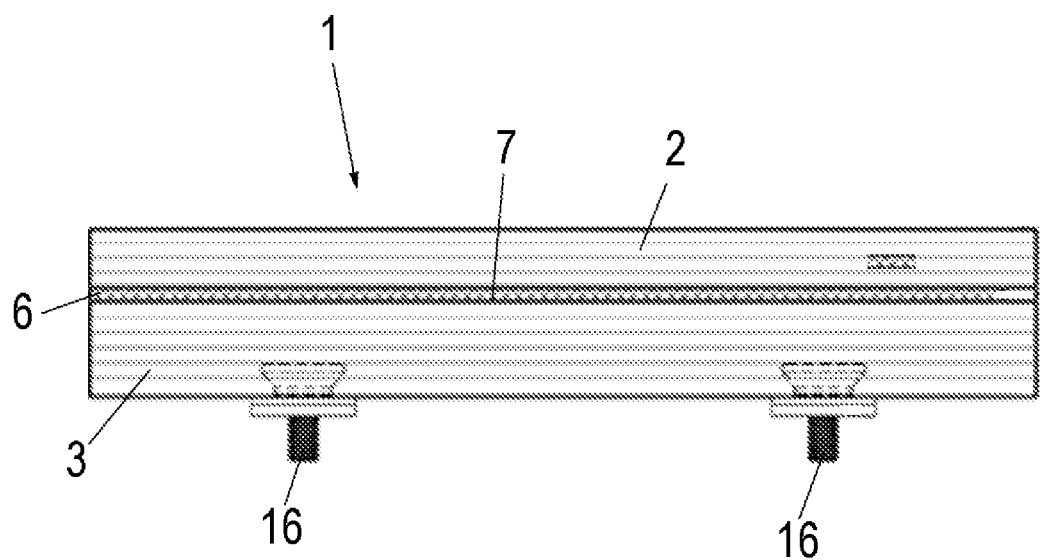

FIG. 23 depicts another variant, in which the back element 3 is a loadbearing glass, stone, or ceramic sheet, in which undercut anchors 16 are anchored. The façade element 1 can be attached in a simple manner on the support structure via the undercut anchors 16.

FIG. 24 illustrates a method according to the invention for producing the façade element 1 according to the invention per the first aspect of the invention.

Here, in a first step a), a flat transparent cover plate 2 that has an outer surface 4 that is intended to face the external environment and an opposite inner surface 5 is provided.

Then, a second step, which is freely selected from the following three (alternative) steps b1), b2), or b3), is carried out:

b1) Patterning the outer surface 4 at least in one region 8, and applying an optical interference layer 9 on the patterned region 8. Here, the inner surface 5 is not patterned and no optical interference layer is applied on the inner surface 5.

b2) Patterning the outer surface 4 at least in one region 8, applying an optical interference layer 9 on the patterned region 8 der outer surface 4, and applying another optical interference layer 9' on the inner surface 5. In this case, the inner surface 5 is not patterned.

b3) Patterning the outer surface 4 at least in one region 8, applying an optical interference layer 9 on the patterned region 8 of the outer surface 4, patterning the inner surface 5 at least in one region 8, and applying another optical interference layer 9' on the patterned region 8 of the inner surface 5.

In addition, in a third step c), a back element 3 is mounted on the inner surface 5 of the cover plate 2.

FIG. 25 illustrates the method according to the invention for producing the façade element 1 according to the invention per the second aspect of the invention.

Here, in a first step a), a flat transparent cover plate 2 that has an outer surface 4 that is intended to face the external environment and an opposite inner surface 5 is provided.

Then, a second step that is freely selected from the following four (alternative) steps b1), b2), b3), or b4) is carried out:

b1) Patterning the outer surface 4 at least in one region, and applying an optical interference layer 9 on the inner surface 5. In this case, no further optical interference layer is applied on the outer surface 4. Also, the inner surface 5 is not patterned.

b2) Patterning the outer surface 4 at least in one region 8, patterning the inner surface 5 at least in one region 8, and applying an optical interference layer 9 on the patterned region of the inner surface 5. In this case, no further optical interference layer is applied on the outer surface 4.

b3) Patterning the inner surface 5 at least in one region 8 and applying an optical interference layer 9 on the patterned region 8 of the inner surface 5. In this case, no further optical interference layer is applied on the outer surface 4. Also, the outer surface 4 is not patterned.

b4) Patterning the inner surface 5 at least in one region 8, applying an optical interference layer 9 on the patterned region 8 of the inner surface 5, and applying a further optical interference layer 9' on the outer surface 4. In this case, the outer surface 4 is not patterned.

In addition, in a third step c), a back element 3 is mounted on the inner surface 5 of the cover plate 2.

FIG. 26 illustrates the measurement setup for determining the diffuse scattering of the façade element 1 according to the invention with a commercially available multi-angle spectrophotometer 17 (multi-angle colorimetry). The patterned region 8 (not shown in detail) extends over the entire cover plate 2 (e.g., glass). A light beam is aimed at various angles at the outer surface 4 of the façade element 1 to be characterized, and the scattered or reflected light is measured spectrally from various viewing angles, for example, 15° or 45° relative to the surface normal of the plane of the cover plate 2. An opaque back element 3, implemented here, for example, as a black, non-glossy layer (e.g., attached with a liquid with a refractive index of approx. 1.5), is situated under the cover plate 2. With the multi-angle spectrophotometer 17, the brightness in the L-a-b system can be determined with D65 standard illumination and 10° aperture angle. It has been found that there is good angular stability (i.e., low angular dependence of the scattered light), if at both 45° and 15° viewing angles and at an angle of incidence of 45°, measured in each case from the glancing angle, there is still at least a brightness of L=10, preferably L=15, and even better L=20. As a result of the at least one patterned region 8 of the outer surface 4 and/or the inner surface 5 of the cover plate 2, at both 45° and 15° viewing angles and at an angle of incidence of 45°, measured in each case from the glancing angle (in both directions), at least a brightness of L=10 can be achieved. The degree data should be understood as follows: reflection angle (relative to the surface normal/angle of incidence (relative to the glancing angle)). For example, with a viewing angle of 45° (measured relative to the surface normal) and an angle of incidence of 45° (measured from the glancing angle), the incident beam strikes exactly perpendicular to the surface (45/45). With a viewing angle of 15° and an angle of incidence of 45°, the incident direction is 30° from the surface normal on the same side as the viewing direction (15/45). The multi-angle spectrophotometer 20 is positioned with a viewing angle of 45° or 15° relative to the surface normal.

As emerges from the above description of the invention, the invention makes available improved façade elements as well as methods for production thereof, which have a very homogeneous, intense color, with little or no directional dependence. The façade elements can be produced cost-effectively in various shapes and sizes and integrated into a façade in a simple manner. Particularly advantageously, the façade elements according to the invention can be used in combination with colored solar modules used as façade elements (coloring as a result of an interference layer or layers), in particular CIGS thin-film solar modules, with a homogeneous color effect being achievable. Here, according to the invention, the semiconductor stack is replaced by other usually less expensive materials; and other elements, such as junction boxes, edge sealing, contact ribbons, and cables can be eliminated. Particularly advantageously, the invention enables production of adapters, which are necessary in particular for the transition to openings or to edges of buildings. With the use of materials of back elements that can be form-lockingly joined, additional costs for attachment on building structures can be saved. The use of the coated glass element and the predefined optical properties of the back element or of the composite material ensures that, by and large, the photovoltaically passive façade elements deliver the same color impression under various light conditions as the solar modules. When non-rectangular façade elements are desired to supplement solar modules, the façade elements according to the invention can be produced far less expensively than solar modules. The invention thus makes available an innovation that brings significant advantages to the practice of façade construction.

LIST OF REFERENCE CHARACTERS 1 façade element
2 cover plate
3 back element
4 outer surface
5 inner surface
6 adhesive layer
7 contact surface
8, 8' patterned region
9, 9' optical interference layer
10, 10' segment
11 first zone
12 second zone
13 mounting element
14 support
15 suspension
16 undercut anchor
17 multi-angle spectrophotometer

The invention claimed is:

1. A passive facade element, comprising:
a transparent cover plate and an opaque black back element mounted on the cover plate, the cover plate having an outer surface facing an external environment and an inner surface facing the opaque black back element, wherein the opaque black back element covers at least 90% of the transparent cover plate and is configured such that less than 5% of total visible light received by the opaque black back element from the transparent cover plate is transmitted by the opaque black back element,
wherein
 i) the outer surface has at least one patterned region, on which an optical interference layer for reflecting light within a predefined wavelength range is arranged,
 ii) an optical interference layer for reflecting light within a predefined wavelength range is arranged on the inner surface, the inner surface and/or the outer surface having at least one patterned region, wherein either
  a) the outer surface has at least one patterned region, or
  b) another optical interference layer for reflecting light within a predefined wavelength range is arranged on the outer surface, or
 iii) an optical interference layer for reflecting light within a predefined wavelength range is arranged on the inner surface, the inner surface having at least one patterned region and the outer surface having no patterned region, wherein no optical interference layer is arranged on the outer surface; and
each of the at least one patterned region has the following features:
perpendicularly to a plane of the cover plate, a height profile with hills and valleys, wherein a mean height difference between the hills and valleys is at least 2 µm,
at least 50% of the patterned region is composed of segments that are inclined relative to the plane of the cover plate, wherein, with reference to the plane of the cover plate, at least 20% of the segments have an inclination angle in a range from greater than 0° to 15°, at least 30% of the segments have an inclination angle in a range from greater than 15° to 45°, and greater than 0% but less than 30% of the segments have an inclination angle greater than 45°; and
the segments are flat and have a segment area of at least 1 um2, the segments having each a mean roughness of less than 15% of a layer thickness of the optical interference layer on the outer surface; and
wherein the at least one patterned region, the optical interference layer, and the opaque black back element together mimic a colored solar module and deliver a same color impression under various light conditions as the colored solar module.

2. The passive facade element according to claim 1, wherein the opaque black back element is configured as one of:
a back coating of the cover plate,
an opaque film fixedly bonded to the cover plate by a transparent adhesive, or
an opaque rigid body fixedly bonded to the cover plate by a transparent adhesive.

3. The passive facade element according to claim 1, wherein the optical interference layer includes a single refraction layer having a refractive index n selected from the group consisting of greater than 1.7, greater than 2.0, or greater than 2.3.

4. The passive facade element according to claim 1, wherein the optical interference layer includes exactly two refraction layers, and wherein a first refraction layer with a first refractive index n1 is arranged on the cover plate with a refractive index nd with |n1−nd|>0.3, a second refraction layer with a second refractive index n2 is arranged on the first refraction layer with |n2−n1|>0.3, and at least one of the refractive indices n1 or n2 is greater than 1.9 or greater than 2.3.

5. The passive facade element according to claim 1, wherein the optical interference layer includes exactly three refraction layers, and wherein
a first refraction layer with a first refractive index n1 is arranged on the cover plate with a refractive index nd with |n1−nd|>0.3,
a second refraction layer with a second refractive index n2 is arranged on the first refraction layer with |n2−n1|>0.3,
a third refraction layer with a third refractive index n3 is arranged on the second refraction layer with |n3−n2|>0.3,
at least one of the refractive indices n1, n2, or n3 is greater than 1.9 or greater than 2.3, and (i) n1>n2 and n3>n2, or (ii) n1<n2 and n3<n2.

6. The passive facade element according to claim 1, wherein at least 80% or at least 90% of the at least one patterned region is composed of segments inclined relative to the plane of the cover plate.

7. The passive facade element according to claim 1, wherein the cover plate has a reflection haze of more than 50% or more than 90%.

8. The passive facade element according to claim 1, wherein the cover plate has the at least one patterned region and is configured such that with viewing angles of 45° and 15° and an angle of incidence that deviates by 45° from a respective glancing angle in both directions, a brightness L of the reflected light occurs, L being selected from the group consisting of at least 10, at least 15, and at least 20.

9. The passive facade element according to claim 1, wherein the opaque black back element has a visible-light transmittance of 0%.

10. A method for producing the passive facade element according to claim 1, comprising:
a) providing a transparent cover plate with an outer surface adapted to face an external environment, and an opposite inner surface;
b) according to alternative i), performing b1), b2) or b3) being
b1) patterning the outer surface at least in one region, and applying an optical interference layer on the patterned region,
b2) patterning the outer surface at least in one region, applying an optical interference layer on the patterned region, and applying another optical interference layer on the inner surface,
b3) patterning the outer surface at least in one region, applying an optical interference layer on the patterned region, patterning the inner surface at least in one region, and applying another optical interference layer on the patterned region of the inner surface;
c) alternatively to b) and according to alternative ii), performing c1), c2) or c3) being
c1) patterning the outer surface at least in one region, and applying an optical interference layer on the inner surface,
c2) patterning the outer surface at least in one region, patterning the inner surface at least in one region, and applying an optical interference layer on the patterned region of the inner surface,
c3) patterning the inner surface at least in one region, and applying an optical interference layer on the patterned region of the inner surface, and applying another optical interference layer on the outer surface;
d) alternatively to b) or c) and according to alternative iii), performing d1) being
d1) patterning the inner surface at least in one region, and applying an optical interference layer on the patterned region of the inner surface, wherein the outer surface is not patterned and no optical interference layer is applied on the outer surface,
wherein the patterned region has the following features:
perpendicularly to a plane of the cover plate, a height profile with hills and valleys, wherein a mean height difference between the hills and valleys is at least 2 µm,
at least 50% of the patterned region is composed of segments that are inclined relative to the plane of the cover plate, wherein, with reference to the plane of the cover plate, at least 20% of the segments have an inclination angle in a range from greater than 0° to 15°, at least 30% of the segments have an inclination angle in a range from greater than 15° to 45°, and greater than 0% but less than 30% of the segments have an inclination angle greater than 45°, and the segments are flat and have a segment area of at least 1 um2, the segments having each a mean roughness of less than 15% of a layer thickness of the optical interference layer on the outer surface; and e) mounting an opaque back element on the inner surface of the cover plate, wherein the opaque back element covers at least 90% of the transparent cover plate and is configured such that less than 5% of total visible light received by the opaque back element from the transparent cover plate is transmitted by the opaque back element.

11. A passive facade element, comprising:

a transparent cover plate and an opaque black back element mounted on the cover plate, the cover plate having an outer surface facing an external environment and an inner surface facing the opaque black back element, wherein the opaque black back element covers at least 90% of the transparent cover plate and is configured such that less than 5% of total visible light received by the opaque black back element from the transparent cover plate is transmitted by the opaque black back element, wherein the outer surface has at least one patterned region, on which an optical interference layer for reflecting light within a predefined wavelength range is arranged;

each of the at least one patterned region has the following features:

perpendicularly to a plane of the cover plate, a height profile with hills and valleys, wherein a mean height difference between the hills and valleys is at least 2 µm, at least 50% of the patterned region is composed of segments that are inclined relative to the plane of the cover plate, wherein, with reference to the plane of the cover plate, at least 20% of the segments have an inclination angle in a range from greater than 0° to 15°, at least 30% of the segments have an inclination angle in a range from greater than 15° to 45°, and greater than 0% but less than 30% of the segments have an inclination angle greater than 45°; and the segments are flat and have a segment area of at least 1 um2, the segments having each a mean roughness of less than 15% of a layer thickness of the optical interference layer on the outer surface; and wherein the at least one patterned region, the optical interference layer, and the opaque black back element together mimic a colored solar module and deliver a same color impression under various light conditions as the colored solar module.

12. The passive facade element according to claim 11, wherein the inner surface has no patterned region and no optical interference layer.

13. The passive facade element according to claim 11, wherein the inner surface has no patterned region, and another optical interference layer for reflecting light within a predefined wavelength range is arranged on the inner surface of the cover plate.

14. The passive facade element according to claim 11, wherein the inner surface has at least one patterned region, on which an optical interference layer for reflecting light within a predefined wavelength range is arranged.

15. A passive facade element, comprising:

a transparent cover plate and an opaque black back element mounted on the cover plate, the cover plate having an outer surface facing an external environment and an inner surface facing the opaque black back element, wherein the opaque black back element covers at least 90% of the transparent cover plate and is configured such that less than 5% of total visible light received by the opaque black back element from the transparent cover plate is transmitted by the opaque black back element, wherein an optical interference layer for reflecting light within a predefined wavelength range is arranged on the inner surface, the inner surface and/or the outer surface having at least one patterned region, wherein either a) the outer surface has at least one patterned region, or b) another optical interference layer for reflecting light within a predefined wavelength range is arranged on the outer surface;

each of the at least one patterned region has the following features:

perpendicularly to a plane of the cover plate, a height profile with hills and valleys, wherein a mean height difference between the hills and valleys is at least 2 µm, at least 50% of the patterned region is composed of segments that are inclined relative to the plane of the cover plate, wherein, with reference to the plane of the cover plate, at least 20% of the segments have an inclination angle in a range from greater than 0° to 15°, at least 30% of the segments have an inclination angle in a range from greater than 15° to 45°, and greater than 0% but less than 30% of the segments have an inclination angle greater than 45°; and the segments are flat and have a segment area of at least 1 um2, the segments having each a mean roughness of less than 15% of a layer thickness of the optical interference layer on the outer surface; and wherein the at least one patterned region, the optical interference layer, and the opaque black back element together mimic a colored solar module and deliver a same color impression under various light conditions as the colored solar module.

16. The passive facade element according to claim 15, wherein the inner surface of the cover plate has at least one patterned region, and the outer surface has at least one patterned region, no optical interference layer being arranged on the outer surface.

17. The passive facade element according to claim 15, wherein the inner surface of the cover plate has at least one patterned region, and the outer surface has no patterned region, another optical interference layer being arranged on the outer surface.

18. The passive facade element according to claim 15, wherein the inner surface of the cover plate has no patterned region, and the outer surface has at least one patterned region, no optical interference layer being arranged on the outer surface.

* * * * *